US009979916B2

(12) United States Patent
Hiyama et al.

(10) Patent No.: US 9,979,916 B2
(45) Date of Patent: May 22, 2018

(54) IMAGING APPARATUS AND IMAGING SYSTEM

(71) Applicant: CANON KABUSHIKI KAISHA, Tokyo (JP)

(72) Inventors: Hiroki Hiyama, Sagamihara (JP); Takamasa Sakuragi, Machida (JP); Junji Iwata, Tokyo (JP); Hiroaki Kameyama, Kawasaki (JP); Tomoya Kumagai, Tokyo (JP); Keisuke Ota, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 143 days.

(21) Appl. No.: 14/929,543

(22) Filed: Nov. 2, 2015

(65) Prior Publication Data
US 2016/0150176 A1 May 26, 2016

(30) Foreign Application Priority Data

Nov. 21, 2014 (JP) ................................. 2014-237006
Mar. 5, 2015 (JP) ................................. 2015-043853

(51) Int. Cl.
*H04N 5/3745* (2011.01)
*H04N 5/376* (2011.01)
(Continued)

(52) U.S. Cl.
CPC ......... *H04N 5/37457* (2013.01); *H04N 5/378* (2013.01); *H04N 5/3745* (2013.01);
(Continued)

(58) Field of Classification Search
CPC .... H04N 5/357; H04N 5/37457; H04N 5/378; H01L 27/14607
See application file for complete search history.

(56) References Cited

U.S. PATENT DOCUMENTS 5,232,165 A 8/1993 Tournier
6,188,094 B1 2/2001 Kochi et al.
(Continued)

FOREIGN PATENT DOCUMENTS

JP H09-284658 10/1997
JP 2010-178173 8/2010

OTHER PUBLICATIONS

U.S. Appl. No. 14/748,483, Seiichirou Sakai, filed Jun. 24, 2015.
(Continued)

*Primary Examiner* — Ahmed A Berhan
(74) *Attorney, Agent, or Firm* — Fitzpatrick, Cella, Harper & Scinto

(57) ABSTRACT

An imaging apparatus includes: a first signal processing circuit arranged in a first direction to process a signal from a first group of pixels; a second signal processing circuit arranged in a second direction to process a signal from a second group of pixels; a first external connecting terminal arranged in the first direction to supply a first potential to the first signal processing circuit; a second external connecting terminal arranged in the second direction to supply the first potential to the second signal processing circuit; a third external connecting terminal arranged in the first direction to supply a second potential to the first group of pixels; and a fourth external connecting terminal arranged in the second direction to supply the second potential to the second group of pixels.

16 Claims, 16 Drawing Sheets

(51) Int. Cl.
 *H04N 5/378* (2011.01)
 *H01L 27/146* (2006.01)

(52) U.S. Cl.
 CPC ....... *H04N 5/3765* (2013.01); *H04N 5/37455* (2013.01); *H01L 27/14607* (2013.01)

(56) References Cited

U.S. PATENT DOCUMENTS

| | | | |
|---|---|---|---|
| 6,670,990 B1 | 12/2003 | Kochi et al. | |
| 6,960,751 B2 | 11/2005 | Hiyama et al. | |
| 7,023,482 B2 | 4/2006 | Sakuragi | |
| 7,110,030 B1 | 9/2006 | Kochi et al. | |
| 7,187,052 B2 | 3/2007 | Okita et al. | |
| 7,283,305 B2 | 10/2007 | Okita et al. | |
| 7,429,764 B2 | 9/2008 | Koizumi et al. | |
| 7,538,804 B2 | 5/2009 | Okita et al. | |
| 7,557,847 B2 | 7/2009 | Okita et al. | |
| 7,638,826 B2 | 12/2009 | Hiyama et al. | |
| 7,755,688 B2 | 7/2010 | Hatano et al. | |
| 7,812,873 B2 | 10/2010 | Hiyama et al. | |
| 7,812,876 B2 | 10/2010 | Hiyama et al. | |
| 7,859,575 B2 | 12/2010 | Ota et al. | |
| 8,045,034 B2 | 10/2011 | Shibata et al. | |
| 8,106,955 B2 | 1/2012 | Okita et al. | |
| 8,120,686 B2 | 2/2012 | Hatano et al. | |
| 8,189,086 B2 | 5/2012 | Hashimoto et al. | |
| 8,208,055 B2 | 6/2012 | Hiyama | |
| 8,218,050 B2 | 7/2012 | Ogura et al. | |
| 8,278,613 B2 | 10/2012 | Okita et al. | |
| 8,310,576 B2 | 11/2012 | Hashimoto et al. | |
| 8,325,260 B2 | 12/2012 | Yamazaki et al. | |
| 8,451,360 B2 | 5/2013 | Nakamura et al. | |
| 8,477,224 B2 | 7/2013 | Ogura et al. | |
| 8,493,487 B2 | 7/2013 | Takada et al. | |
| 8,598,901 B2 | 12/2013 | Hiyama et al. | |
| 8,638,384 B2 | 1/2014 | Sakuragi | |
| 8,648,944 B2 | 2/2014 | Iwata | |
| 8,697,500 B2 | 4/2014 | Iwata | |
| 8,711,259 B2 | 4/2014 | Maehashi et al. | |
| 8,836,838 B2 | 9/2014 | Nakamura et al. | |
| 8,884,864 B2 | 11/2014 | Sakuragi | |
| 8,922,668 B2 | 12/2014 | Ota | |
| 8,928,786 B2 | 1/2015 | Iwata et al. | |
| 9,029,752 B2 | 5/2015 | Saito et al. | |
| 9,083,906 B2 | 7/2015 | Nakamura et al. | |
| 2005/0174552 A1 | 8/2005 | Takada et al. | |
| 2007/0205439 A1 | 9/2007 | Okita et al. | |
| 2008/0024630 A1* | 1/2008 | Hiyama | H04N 5/3651 348/241 |
| 2010/0321532 A1 | 12/2010 | Hashiimoto et al. | |
| 2011/0136291 A1 | 6/2011 | Iwata et al. | |
| 2012/0043454 A1 | 2/2012 | Sakuragi | |
| 2014/0312207 A1 | 10/2014 | Ikeda et al. | |
| 2014/0320717 A1 | 10/2014 | Hiyama et al. | |
| 2015/0062394 A1 | 3/2015 | Ikeda et al. | |
| 2015/0077607 A1 | 3/2015 | Yamazaki et al. | |
| 2015/0109504 A1 | 4/2015 | Sakuragi | |
| 2015/0109505 A1 | 4/2015 | Sakuragi | |
| 2015/0189249 A1 | 7/2015 | Hiyama et al. | |
| 2015/0237286 A1 | 8/2015 | Saito et al. | |
| 2015/0281615 A1 | 10/2015 | Kobayashi et al. | |
| 2015/0326812 A1 | 11/2015 | Sakuragi | |

OTHER PUBLICATIONS

U.S. Appl. No. 14/751,926, Takamasa Sakuragi, filed Jun. 26, 2015.

\* cited by examiner und the second group of pixels receives the second voltage from the fourth external connecting terminal, without receiving the second voltage from the third external connecting terminal.

Further features of the present invention will become apparent from the following description of exemplary embodiments with reference to the attached drawings.

IMAGING APPARATUS AND IMAGING SYSTEM

BACKGROUND OF THE INVENTION

Field of the Invention

The present invention relates to an imaging apparatus and an imaging system which are used in a scanner, a video camera, a digital still camera and the like.

Description of the Related Art

An imaging apparatus is known that includes a pixel region in which pixels each containing a photoelectric conversion element are arrayed, and a readout circuit for reading out the signals. For instance, Japanese Patent Application Laid-Open No. H09-284658 discloses an imaging apparatus that includes a pixel region which has pixels that are each driven by a power source voltage arrayed therein, and a pixel signal processing circuit which processes signals sent from the pixel region while regarding a reference voltage as a reference.

The above described imaging apparatus has such a problem that a magnetic field incident externally is captured by a loop which includes a supplying wire for the power source voltage that is supplied to a pixel unit and a supplying wire for the reference voltage that is supplied to the pixel signal processing circuit, and the captured magnetic field is observed as noise.

An object of the present invention is to provide an imaging apparatus and an imaging system which can reduce the noise originating in the magnetic field incident externally.

SUMMARY OF THE INVENTION

According to an aspect of the present invention, an imaging apparatus comprises: a pixel region including a first group of pixels configured to perform a photoelectric conversion and a second group of pixels configured to perform the photoelectric conversion, each of pixels in the first and second groups being a pixel which outputs an output signal based on the photoelectric conversion; a first signal processing unit arranged in a first direction with regard to the pixel region, and configured to perform a signal processing of the output signal from the first group of pixels; a second signal processing unit arranged in a second direction different from the first direction, with regard to the pixel region, and configured to perform a signal processing of the output signal from the second group of pixels; a first external connecting terminal arranged in the first direction with regard to the pixel region, and configured to supply a first voltage; a second external connecting terminal arranged in the second direction with regard to the pixel region, and configured to supply the first voltage; a third external connecting terminal arranged in the first direction with regard to the pixel region, and configured to supply a second voltage; and a fourth external connecting terminal arranged in the second direction with regard to the pixel region, and configured to supply the second voltage, wherein the first signal processing unit receives the first voltage from the first external connecting terminal, without receiving the first voltage from the second external connecting terminal, the second signal processing unit receives the first voltage from the second external connecting terminal, without receiving the first voltage from the first external connecting terminal, the first group of pixels receives the second voltage from the third external connecting terminal, without receiving the second voltage from the fourth external connecting terminal,

DESCRIPTION OF THE EMBODIMENTS

Preferred embodiments of the present invention will now be described in detail in accordance with the accompanying drawings.

First Embodiment

Figure 1:
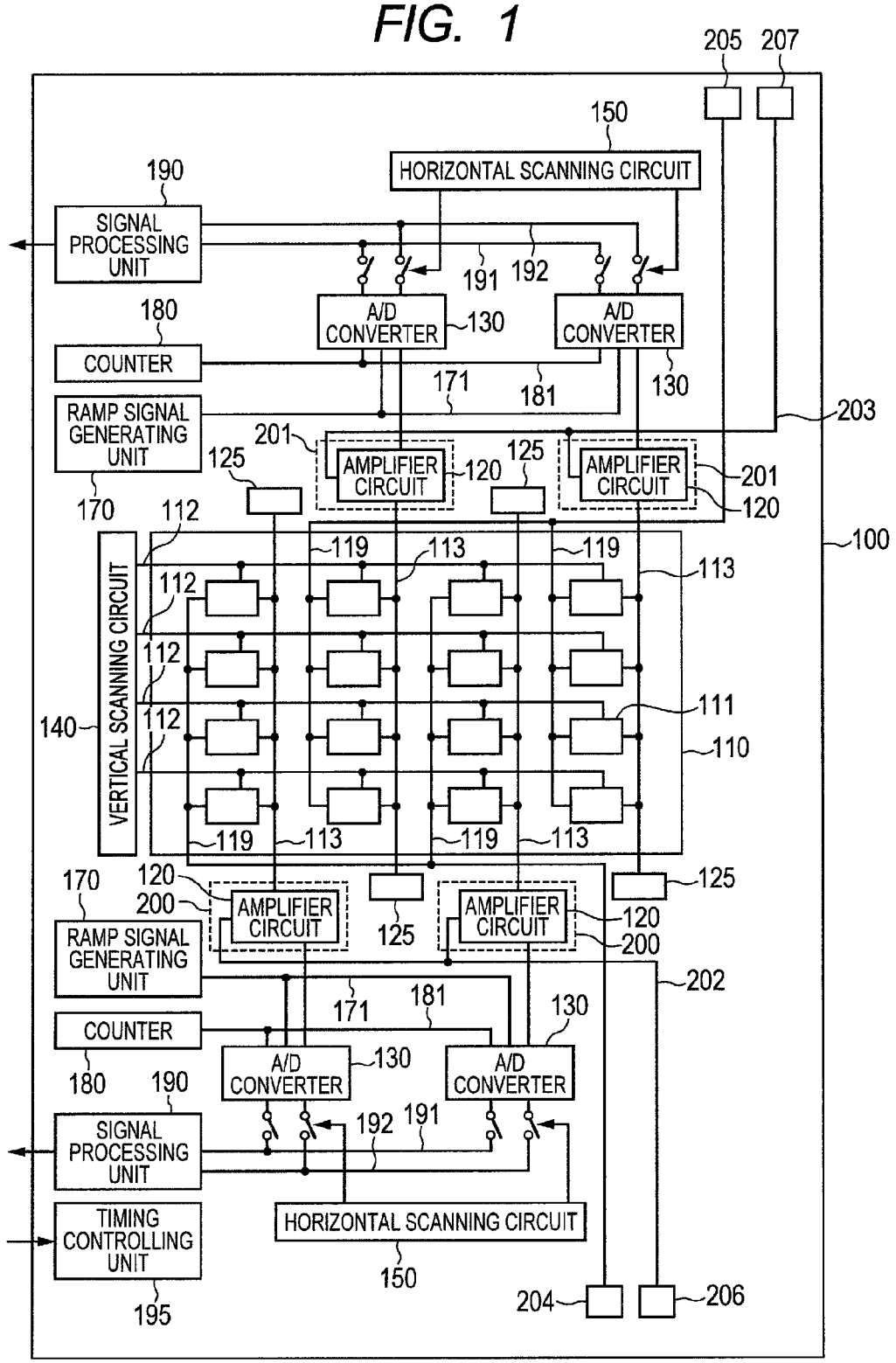
FIG. 1 is a schematic diagram illustrating an imaging apparatus of a first embodiment of the present invention.

FIG. 1 is a view illustrating a configuration example of an imaging apparatus 100 according to a first embodiment of the present invention. The imaging apparatus 100 is a CMOS image sensor, photoelectrically converts light incident from an object image, and outputs an electric signal which has been output by the photoelectric conversion, to the outside as digital data. The imaging apparatus 100 has a pixel region 110 in which a plurality of pixels 111 are arranged in a matrix form. Each of the pixels 111 photoelectrically converts the incident light. FIG. 1 illustrates the pixels 111 which are simplified into four rows and four columns for simplicity, but actually, a larger number of pixels 111 are provided in a larger matrix form. The pixels 111 in the pixel region 110 are referred to as a first column, a second column, a third column and a fourth column from the left side in FIG. 1, and are referred to as a first row, a second row, a third row and a fourth row from the lower side in FIG. 1.

The imaging apparatus 100 further has a vertical scanning circuit 140. The vertical scanning circuit 140 sequentially supplies a driving pulse signal to a row selecting line 112 which is arranged for each row of the pixels 111. When the driving pulse signal is supplied to the row selecting line 112, each of the pixels 111, which is contained in the row of the pixels 111 corresponding to the row selecting line, outputs the photoelectrically converted electric charge to a vertical output line 113 in each of the columns as an analog voltage signal. The vertical output line 113 in each of the columns is provided in each column of the pixel 111, and is connected to a current source 125. The current source 125 may be a constant current source, or may also be a variable current source. In the present embodiment, each of the pixels 111 has the processing of outputting a noise signal which is a signal of a reset level of the pixel 111, and the processing of outputting such a pixel signal that a noise signal is overlapped on a signal corresponding to the electric charge generated by the photoelectric conversion. A value obtained by subtracting the noise signal from the pixel signal shows an effective value.

The imaging apparatus 100 further has analog signal processing circuits 200 and 201 and an analog/digital (A/D) converter 130, on each of the vertical output lines 113. The analog signal processing circuits 200 and 201 have each an amplifying circuit 120, and perform analog signal processing of amplifying an analog signal which has been input from the pixel 111 through the vertical output line 113, and supplying the amplified analog signal to the A/D converter 130.

The analog signal processing circuit 200 is a first signal processing circuit, is arranged in a first direction (lower direction in FIG. 1) with regard to the pixel region 110, and subjects signals which have been output from the pixels (first group of pixels) 111 in odd-numbered columns, to signal processing. The pixels 111 in the odd-numbered columns are a first group of pixels, and perform photoelectric conversion. The analog signal processing circuit 201 is a second signal processing circuit, is arranged in a second direction (upper direction in FIG. 1) with regard to the pixel region 110, which is different from the first direction, and subjects signals which have been output from the pixels (second group of pixels) 111 in even-numbered columns, to signal processing. The pixels 111 in the even-numbered columns are a second group of pixels, and perform photoelectric conversion. The second direction (upper direction in FIG. 1) is an opposite direction to the first direction (lower direction in FIG. 1). The analog signal processing circuit 200 is connected to the pixels (first group of pixels) 111 in the odd-numbered columns, through the vertical output line 113. The analog signal processing circuit 201 is connected to the pixels (second group of pixels) 111 in the even-numbered columns, through the vertical output line 113. Thereby, each of the analog signal processing circuits 200 and 201 can be arranged at a pitch twice as many as the pitch of the pixel 111, and the imaging apparatus 100 having a small size of the pixels 111 can be achieved. The A/D converter 130 converts an analog signal which is output from the analog signal processing circuit 200 or 201, into digital data, and outputs the digital data.

Figure 2:
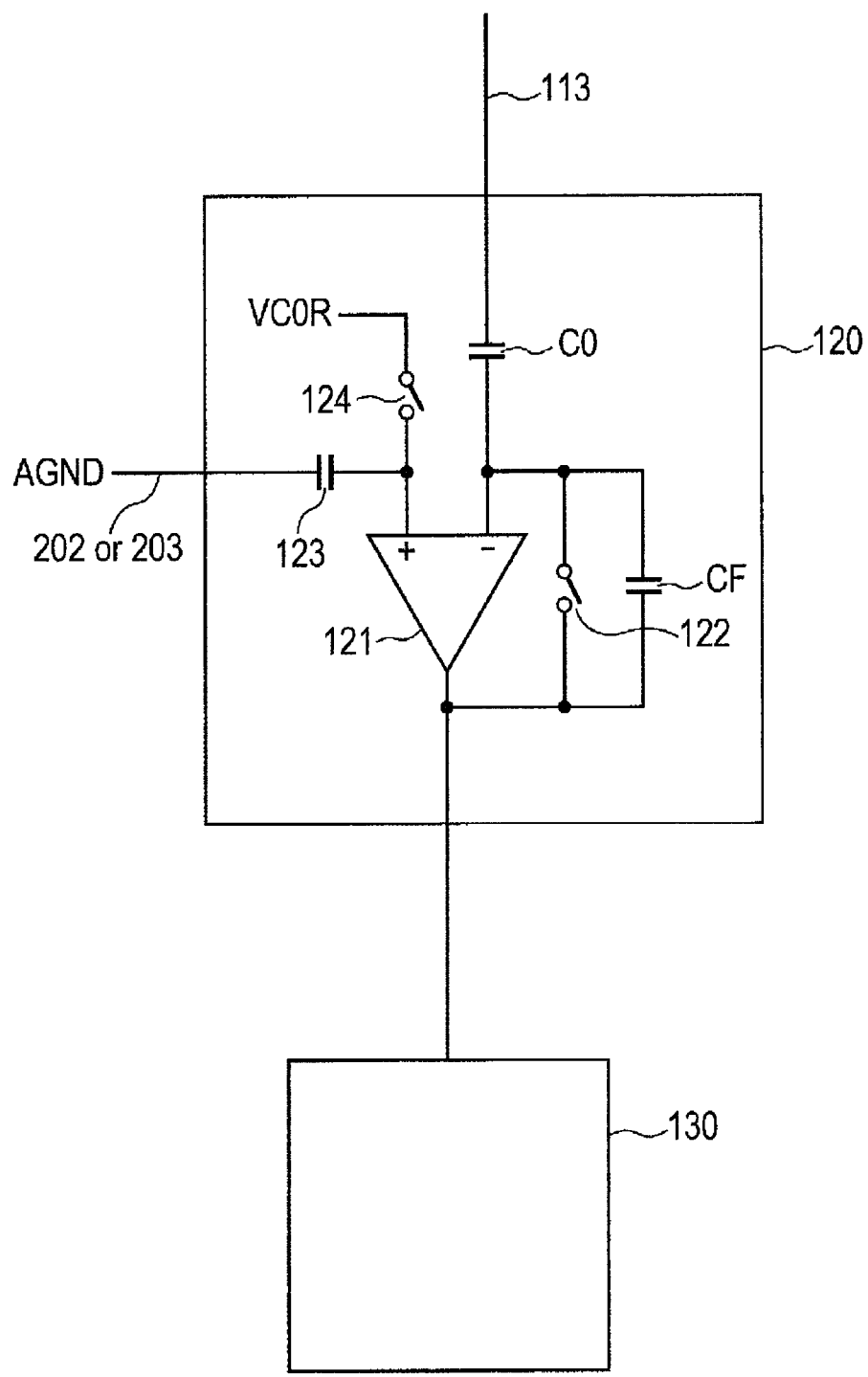
FIG. 2 is a circuit diagram of an amplifying circuit in the first embodiment of the present invention.

FIG. 2 is a view illustrating a configuration example of the amplifying circuit 120. A sample holding capacitor 123 is connected to a non-inverting input terminal of an operational amplifier 121. The sample holding capacitor 123 is connected to a node of a voltage VC0R through a sample holding switch 124. The other end of the sample holding capacitor 123 is connected to an external connecting terminal 206 or 207 of a reference voltage AGND (FIG. 5), through a reference voltage supplying wire 202 or 203. Specifically, in the amplifying circuit 120 in the analog signal processing circuit 200, the other end of the sample holding capacitor 123 is connected to a first external connecting terminal 206 of the reference voltage AGND (FIG. 5), through the reference voltage supplying wire 202. In the amplifying circuit 120 in the analog signal processing circuit 201, the other end of the sample holding capacitor 123 is connected to a second external connecting terminal 207 of the reference voltage AGND (FIG. 5), through the reference voltage supplying wire 203. On the other hand, a feedback capacitor CF and a reset switch 122 are connected in between an inverting input terminal and an output terminal of the operational amplifier 121, in parallel. In addition, an input capacitor C0 is connected in between the vertical output line 113 and the inverting input terminal of the operational amplifier 121. The amplifying circuit 120 amplifies the change in the potential of the vertical output line 113, by a gain ratio of −(C0/CF). The specific operation will be described later with reference to a timing chart. An output terminal of the operational amplifier 121 is connected to the A/D converter 130.

Firstly, the analog signal processing circuit 200 in FIG. 1 will be described below. The analog signal processing circuit 200 has a first amplifying circuit 120 which receives a supply of the reference voltage AGND (FIG. 5) from the first external connecting terminal 206, and amplifies a signal output from the pixel 111 in the odd-numbered column. The first amplifying circuit 120 has the first operational amplifier 121, and the non-inverting input terminal of the first operational amplifier 121 is connected to the first external connecting terminal 206 through a first capacitor 123.

Next, the analog signal processing circuit 201 in FIG. 1 will be described below. The analog signal processing circuit 201 has a second amplifying circuit 120 which receives a supply of a power source voltage SVDD (FIG. 5) from the second external connecting terminal 207, and amplifies a signal output from the pixel 111 in the even-numbered column. The second amplifying circuit 120 has a second operational amplifier 121, and a non-inverting input terminal of the second operational amplifier 121 is connected to the second external connecting terminal 207 through a second capacitor 123.

In FIG. 1, the imaging apparatus 100 further has a ramp signal generating unit 170 and a counter 180. The ramp signal generating unit 170 generates a ramp signal Vramp of which the level changes with time, and supplies the ramp signal Vramp to each of the A/D converters 130 through a ramp signal line 171. The counter 180 supplies a count value Cnt to each of the A/D converters 130 through a count data line 181. A gray counter and a binary counter, for instance, can be used as the counter 180. The counter 180 may be an up-counter, or may also be a down-counter. In the present embodiment, an example will be described below in which a plurality of A/D converters 130 share the ramp signal generating unit 170 and the counter 180, but the ramp signal generating unit 170 and the counter 180 may be provided for each of the A/D converters 130.

When the ramp signal generating unit 170 starts changing the level of the ramp signal Vramp, the counter 180 starts counting the count value Cnt. The level of the ramp signal Vramp monotonically increases with a lapse of time. When the ramp signal Vramp becomes larger than the analog output signal of the amplifying circuit 120, the A/D converter 130 writes the count value Cnt which the counter 180 outputs, in a holding unit. The count value Cnt which has been written in the holding unit is digital data, and is output to a digital signal line 191 or 192. Thereby, the A/D converter 130 can convert the analog signal which the amplifying circuit 120 outputs, into the digital data.

The imaging apparatus 100 further has a horizontal scanning circuit 150 and a signal processing unit 190. The horizontal scanning circuit 150 sequentially transfers the digital data which the A/D converter 130 in each of the columns outputs, to the digital signal lines 191 and 192 column by column. The digital data which has been transferred to the digital signal lines 191 and 192 is supplied to a signal processing unit 190. The digital data which shows a noise signal is output to the digital signal line 191. The digital data which shows a pixel signal is output to the digital signal line 192. The signal processing unit 190 subtracts the digital data of the digital signal line 191, which shows the noise signal, from the digital data of the digital signal line 192, which shows the pixel signal, and outputs an effective pixel value to the outside.

The imaging apparatus 100 further has a timing controlling unit 195 which supplies a pulse signal to each of the above described components, and controls the operation of the imaging apparatus 100. In FIG. 1, signal lines are omitted through which the timing controlling unit 195 transmits the pulse signals to each of the components. The pulse signal which is supplied from the timing controlling unit 195 will be described in detail below, with reference to a timing chart that will be described later.

The first external connecting terminal 206 is arranged in a first direction (lower direction in FIG. 1) with regard to the pixel region 110, and supplies a reference voltage (first potential) AGND (FIG. 5) to the amplifying circuit 120 in the analog signal processing circuit 200, through the reference voltage supplying wire 202. The second external connecting terminal 207 is arranged in a second direction (upper direction in FIG. 1) with regard to the pixel region 110, and supplies a reference voltage (first potential) AGND (FIG. 5) to the amplifying circuit 120 in the analog signal processing circuit 201, through the reference voltage supplying wire 203.

A third external connecting terminal 204 is arranged in the first direction (lower direction in FIG. 1) with regard to the pixel region 110, and supplies a power source voltage (second potential) SVDD (FIG. 5) to the pixels 111 in the odd-numbered columns through a wire 119. A fourth external connecting terminal 205 is arranged in a second direction (upper direction in FIG. 1) with regard to the pixel region 110, and supplies a power source voltage (second potential) SVDD (FIG. 5) to the pixels 111 in the even-numbered columns through the wire 119.

Figure 3:
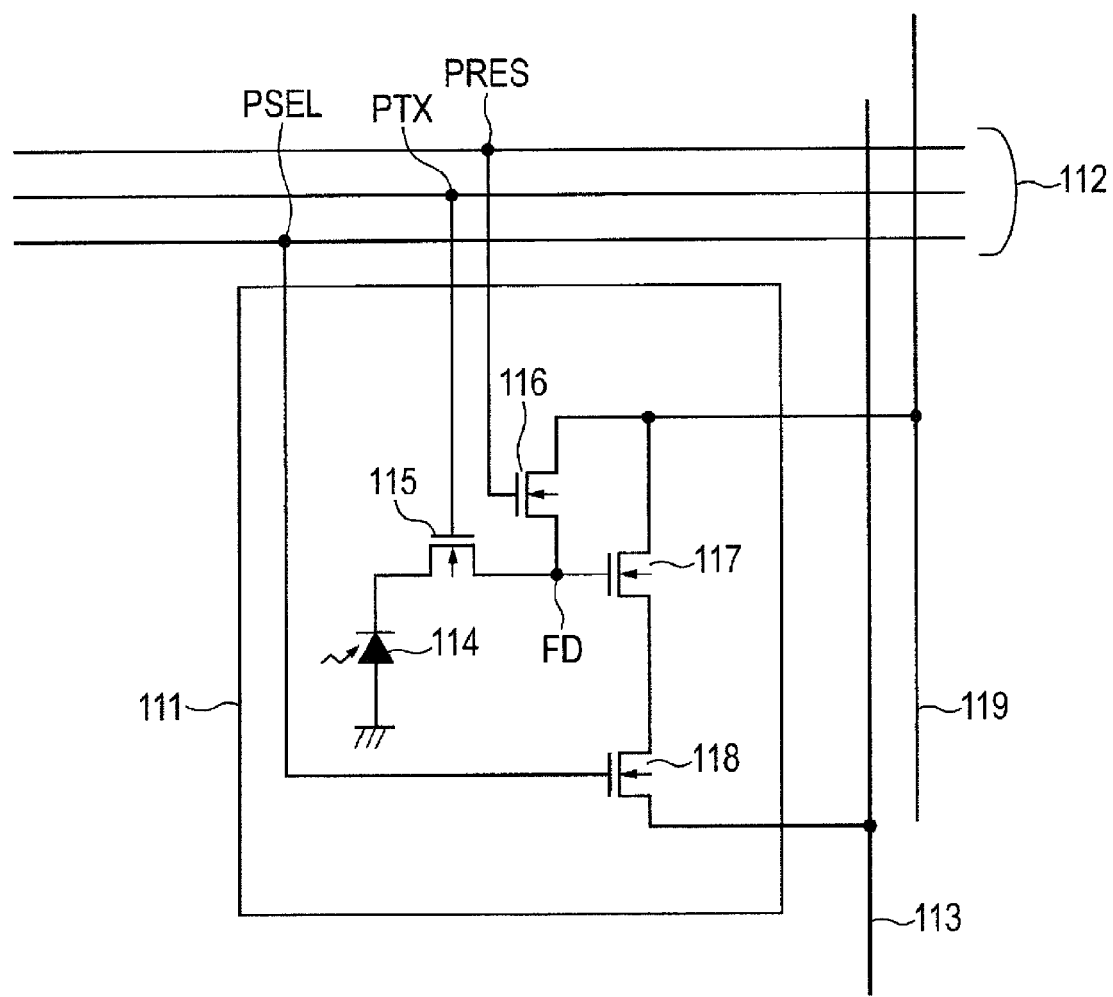
FIG. 3 is a circuit diagram of a pixel in the first embodiment of the present invention.

FIG. 3 is a circuit diagram illustrating a configuration example of the pixel 111; and the pixel 111 has a photodiode 114 which performs photoelectric conversion, and a plurality of transistors 115 to 118. The photodiode 114 is a photoelectric conversion portion which is connected to a floating diffusion FD through a transfer switch 115, and generates an electric charge (electron) based on light. The transfer switch 115 switches connection and disconnection between the photodiode 114 and the floating diffusion FD. The floating diffusion FD is connected to the external connecting terminal 204 or 205 of the power source voltage SVDD through a reset switch 116 and the wire 119, and also is connected to the gate electrode of an amplifying transistor 117. The reset switch 116 switches connection and disconnection between the floating diffusion FD and the power source voltage. A first main electrode of the amplifying transistor 117 is connected to the external connecting terminal 204 or 205 of the power source voltage SVDD, through the wire 119. A second main electrode of the amplifying transistor 117 is connected to the vertical output line 113, through a row selecting switch 118. The row selecting switch 118 switches connection and disconnection between the second main electrode of the amplifying transistor 117 and the vertical output line 113. The amplifying transistor 117 is a pixel output portion which outputs an output signal based on the potential of the floating diffusion FD. The gate electrode of the row selecting switch 118 is connected to a row selecting line PSEL which is one of row control lines 112. The gate electrode of the reset switch 116 is connected to a reset line PRES which is one of the row control lines 112. In addition, the gate electrode of the transfer switch 115 is connected to a transfer line PTX which is one of the row control lines 112.

Figure 4:
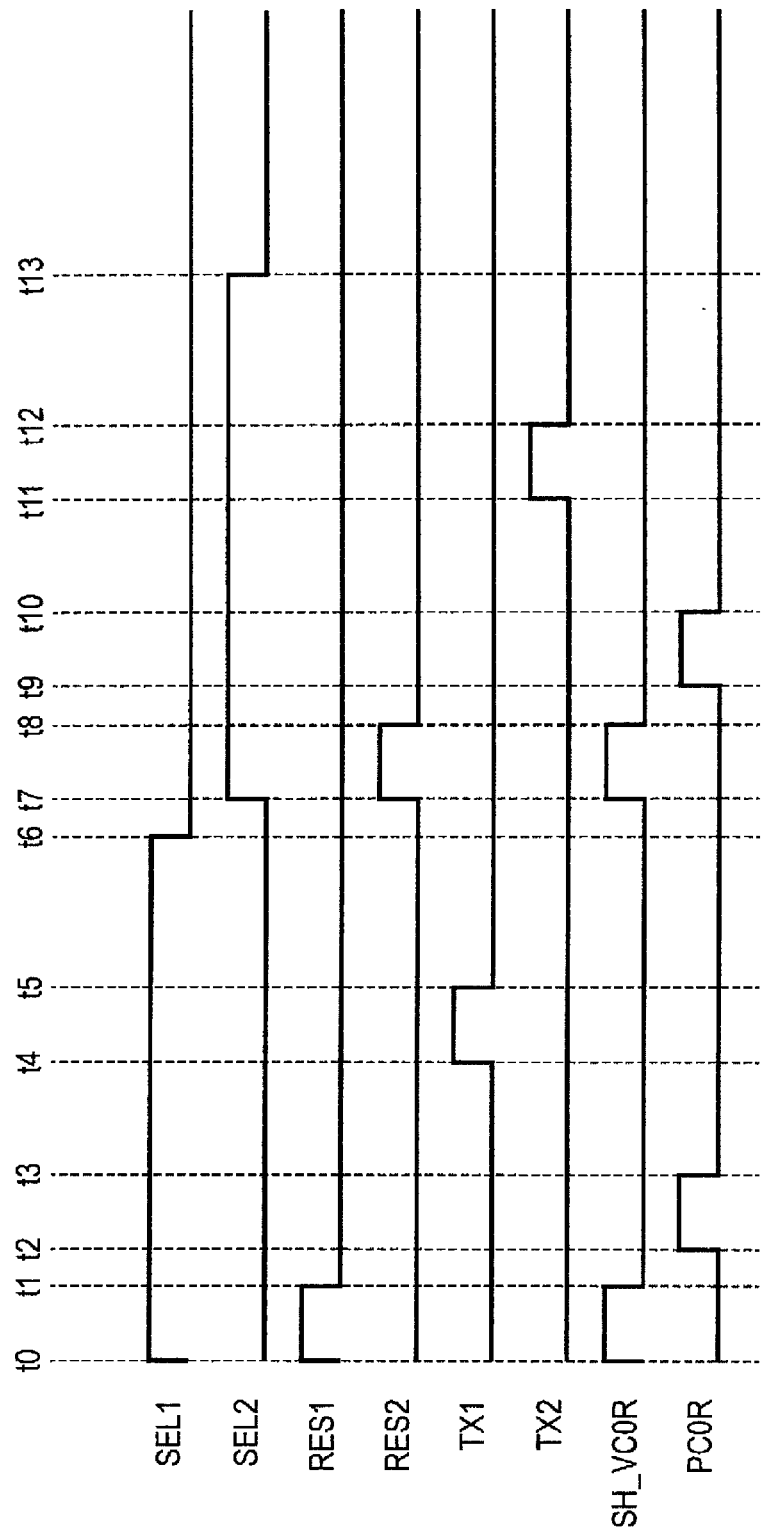
FIG. 4 is a timing chart for driving the first embodiment of the present invention.

FIG. 4 is a timing chart illustrating a method of driving the imaging apparatus 100. A row selecting signal SEL1 is a signal of the row selecting line PSEL for the pixels 111 in the first row. A row selecting signal SEL2 is a signal of the row selecting line PSEL for the pixels 111 in the second row. A reset signal RES1 is a signal of the reset line PRES for the pixels 111 in the first row. A reset signal RES2 is a signal of the reset line PRES for the pixels 111 in the second row. A transfer signal TX1 is a signal of the transfer line PTX for the pixels 111 in the first row. A transfer signal TX2 is a signal of the transfer line PTX for the pixels 111 in the second row. Each of the row selecting signal SEL1, the row selecting signal SEL2, the reset signal RES1, the reset signal RES2, the transfer signal TX1 and the transfer signal TX2 is a control signal which controls the pixel 111.

Firstly, at the time t0, the row selecting signal SEL1 for the first row becomes a high level; the row selecting switch 118 in the first row is turned on; and the amplifying transistor 117 in the first row is connected to the vertical output line 113, and operates as a source follower. Similarly, at the time t0, the reset signal RES1 for the first row becomes a high level, the reset switch 116 in the first row is turned on, and the floating diffusion FD in the first row is reset to the power source voltage SVDD.

In a period between the time t0 and the time t1, a control signal SH_VC0R becomes a high level; and in the amplifying circuit 120, the sample holding switch 124 is turned on, and the sample holding capacitor 123 is connected to the node of the voltage VC0R. At the time t1, the voltage VC0R is held in the sample holding capacitor 123.

At the time t1, the reset signal RES1 for the first row becomes a low level, and the reset switch 116 in the first row is turned off. After that, in the first row, the amplifying transistor 117 outputs the noise signal to the vertical output line 113, based on the voltage by which the floating diffusion FD has been reset. This noise signal is referred to as an N signal. The N signal is amplified by the amplifying circuit 120, and then the amplified N signal is converted into a digital signal by the A/D converter 130.

In a period between the time t1 and the time t7, the control signal SH_VC0R is a low level, the sample holding switch 124 is turned off, and such a voltage that a voltage which is approximately equal to the held voltage VC0R is overlapped on the reference voltage AGND is applied to the non-inverting input terminal of the operational amplifier 121. In other words, in the period between the time t1 and the time t7, the operational amplifier 121 operates while regarding the reference voltage AGND as a reference.

In a period between the time t2 and the time t3, the control signal PC0R becomes a high level, the reset switch 122 in the amplifying circuit 120 is turned on, and the amplifying circuit 120 clamps the N signal which has been input in the vertical output line 113. After the time t3, the amplifying circuit 120 amplifies the change in the potential of the vertical output line 113 by a factor of −(C0/CF), and outputs the amplified signal.

Next, in a period between the time t4 and the time t5, the transfer signal TX1 for the first row becomes a high level, and the transfer switch 115 in the first row is turned on. Thereby, in the first row, a photoelectrically converted signal in the photodiode 114 is transferred to the floating diffusion FD, and is added and averaged on the floating diffusion FD. The amplifying transistor 117 outputs the pixel signal to the vertical output line 113, based on the signal of the floating diffusion FD. This pixel signal is a signal in which the photoelectrically converted signal in the photodiode 114 is overlapped on the above N signal, and accordingly is referred to as an N+S signal. The N+S signal is amplified by the amplifying circuit 120, and then the amplified N+S signal is converted into the digital signal by the A/D converter 130, similarly to the N signal.

Next, at the time t6, the row selecting signal SEL1 for the first row becomes a low level, the row selecting switch 118 in the first row is turned off, and a reading operation for the first row ends. Subsequently, in a period between the time t7 and the time t13, the similar operation is repeatedly performed on the second row.

At the time t7, the row selecting signal SEL2 for the second row becomes a high level; the row selecting switch 118 in the second row is turned on; and the amplifying transistor 117 in the second row is connected to the vertical output line 113, and operates as a source follower. Similarly, at the time t7, the reset signal RES2 for the second row becomes a high level, the reset switch 116 in the second row is turned on, and the floating diffusion FD in the second row is reset to the power source voltage SVDD.

In a period between the time t7 and the time t8, the control signal SH_VC0R becomes the high level; and in the amplifying circuit 120, the sample holding switch 124 is turned on, and the sample holding capacitor 123 is connected to the node of the voltage VC0R. At the time t8, the voltage VC0R is held in the sample holding capacitor 123.

At the time t8, the reset signal RES2 for the second row becomes a low level, and the reset switch 116 in the second row is turned off. After that, in the second row, the amplifying transistor 117 outputs the N signal to the vertical output line 113, based on the voltage by which the floating diffusion FD has been reset. The N signal is amplified by the amplifying circuit 120, and then the amplified N signal is converted into the digital signal by the A/D converter 130.

After the time t8, the control signal SH_VC0R is the low level, the sample holding switch 124 is turned off, and such a voltage that the voltage which is approximately equal to the held voltage VC0R is overlapped on the reference voltage AGND is applied to the non-inverting input terminal of the operational amplifier 121. In other words, after the time t8, the operational amplifier 121 operates while regarding the reference voltage AGND as a reference.

In a period between the time t9 and the time t10, the control signal PC0R becomes the high level, the reset switch 122 in the amplifying circuit 120 is turned on, and the amplifying circuit 120 clamps the N signal which has been input in the vertical output line 113. After the time t10, the amplifying circuit 120 amplifies the change in the potential of the vertical output line 113 by a factor of −(C0/CF), and outputs the amplified signal.

Next, in a period between the time t11 and the time t12, the transfer signal TX2 for the second row becomes a high level, and the transfer switch 115 in the second row is turned on. Thereby, in the second row, a photoelectrically converted signal in the photodiode 114 is transferred to the floating diffusion FD, and is added and averaged on the floating diffusion FD. The amplifying transistor 117 outputs the N+S signal to the vertical output line 113, based on the signal of the floating diffusion FD. The N+S signal is amplified by the amplifying circuit 120, and then the amplified N+S signal is converted into the digital signal by the A/D converter 130, similarly to the N signal.

Figure 5:
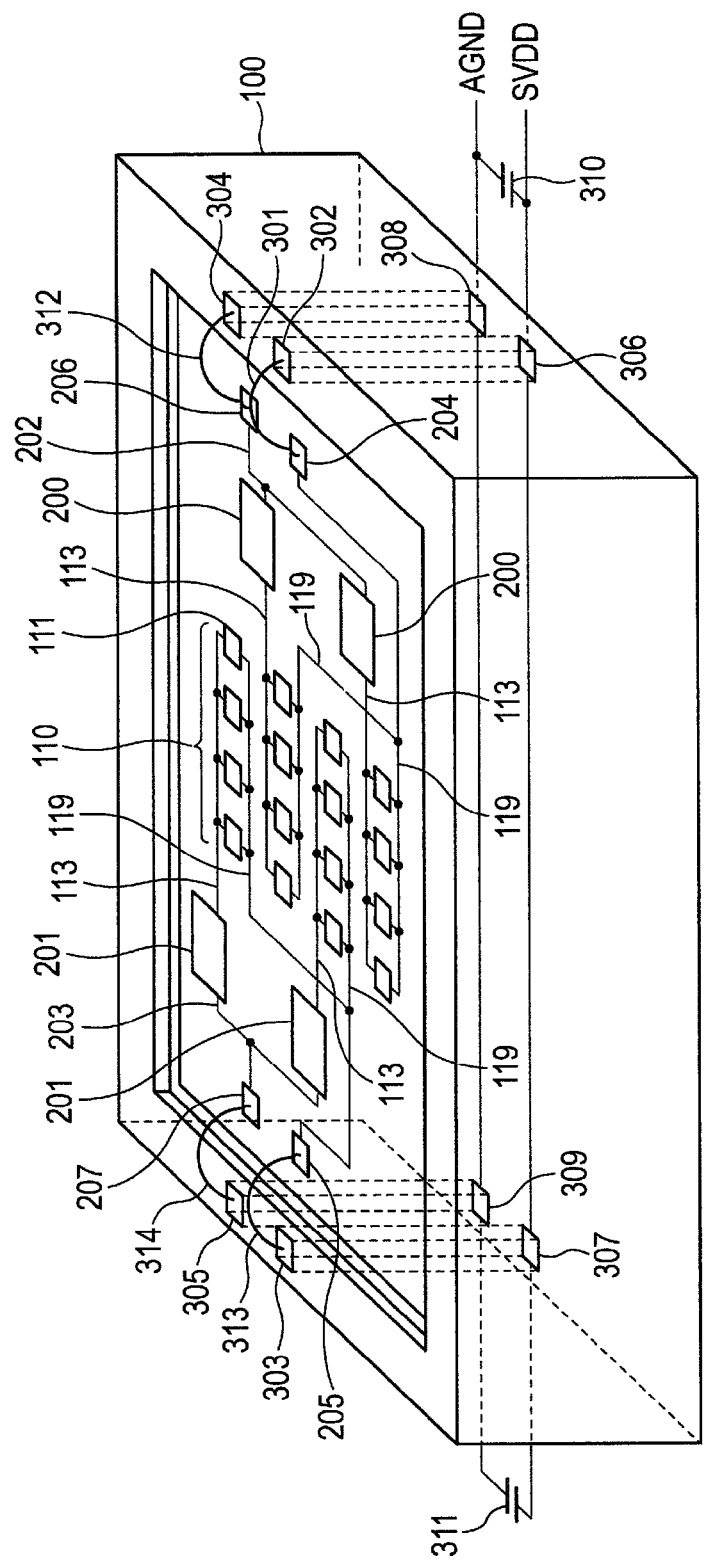
FIG. 5 is a schematic perspective view of the imaging apparatus of the first embodiment of the present invention.

FIG. 5 is a perspective view of the imaging apparatus 100 according to the present embodiment, and is a view for describing an influence of an external magnetic field on the imaging apparatus 100. The imaging apparatus 100 has a form of LGA (Land Grid Array), but the form is not limited to the LGA. The imaging apparatus 100 is covered with a package, and has connecting terminals 302 to 305 on the package side and lands 306 to 309 in the package.

The pixel region 110, the analog signal processing circuit 200, the analog signal processing circuit 201, the first external connecting terminal 206, the second external connecting terminal 207, the third external connecting terminal 204 and the fourth external connecting terminal 205 are formed on the same semiconductor substrate. All of the pixels 111 are formed in a region of a first well. The power source voltage SVDD which is supplied to the pixels 111 is not connected to the first well.

The analog signal processing circuit 200 does not receive a supply of the reference voltage AGND from the second external connecting terminal 207, but receives the supply of the reference voltage AGND from the first external connecting terminal 206. The analog signal processing circuit 201 does not receive the supply of the reference voltage AGND from the first external connecting terminal 206, but receives the supply of the reference voltage AGND from the second external connecting terminal 207. The reference voltage AGND is, for instance, the ground potential.

The pixels 111 in the odd-numbered column do not receive a supply of the power source voltage SVDD from the fourth external connecting terminal 205, but receive the supply of the power source voltage SVDD from the third external connecting terminal 204. The pixels 111 in the even-numbered column do not receive the supply of the power source voltage SVDD from the third external connecting terminal 204, but receive the supply of the power source voltage SVDD from the fourth external connecting terminal 205.

The analog signal processing circuit 200 is arranged in the first direction (right direction in FIG. 5) with regard to the pixel region 110, and signals of the pixels 111 in the odd-numbered column are input thereinto. The power source voltage SVDD is supplied to the pixels 111 in the odd-numbered column through the following power source supplying path. The power source voltage SVDD is supplied to the pixels 111 in the odd-numbered column, from the wiring pattern on the packaging substrate, through the land 306, a through-via (shown by dotted line), the connecting terminal 302 on the package side, a bonding wire 301, the third external connecting terminal 204 of the imaging apparatus 100, and the wire 119.

In addition, the reference voltage AGND is supplied to the analog signal processing circuit 200 which is arranged in the first direction, through the following reference voltage supplying path. The reference voltage AGND is supplied to the analog signal processing circuit 200 through the land 308, a through-via (shown by dotted line), the connecting terminal 304 on the package side, a bonding wire 312, the first external connecting terminal 206 of the imaging apparatus 100, and the wire 202.

A decoupling capacitor 310 is connected in between a wiring pattern through which the power source voltage SVDD is supplied to the land 306 and a wiring pattern through which the reference voltage AGND is supplied to the land 308. The loop can capture the external magnetic field, which is formed of the above described power source supplying path, the reference voltage supplying path, the vertical output line 113, and the decoupling capacitor 310 on the packaging substrate. At this time, in the present embodiment, both of the third external connecting terminal 204 which supplies the power source voltage SVDD and the first external connecting terminal 206 which supplies the reference voltage AGND are positioned in the first direction with regard to the pixel region 110, and accordingly the area of this loop results in being small. Accordingly, the imaging apparatus can decrease the contamination of the noise which originates in the external magnetic field, and can reduce the noise which originates in the magnetic field incident externally.

Similarly, the analog signal processing circuit 201 is arranged in the second direction (left direction in FIG. 5) with regard to the pixel region 110, and signals of the pixels 111 in the even-numbered column are input thereinto. The power source voltage SVDD is supplied to the pixels 111 in the even-numbered column through the following power source supplying path. The land 307 is connected to the land 306, and the land 309 is connected to the land 308. The decoupling capacitor 311 is connected in between the lands 307 and 309, and the power source voltage SVDD is charged in the decoupling capacitor. The power source voltage SVDD is supplied to the pixels 111 in the even-numbered column, through the land 307, a through-via (shown by dotted line), the connecting terminal 302 on the package side, a bonding wire 313, the fourth external connecting terminal 205 of the imaging apparatus 100, and the wire 119.

In addition, the reference voltage AGND is supplied to the analog signal processing circuit 201 which is arranged in the second direction, through the following reference voltage supplying path. The reference voltage AGND is supplied to the analog signal processing circuit 201, through the land 309, a through-via (shown by dotted line), the connecting terminal 305 on the package side, a bonding wire 314, the second external connecting terminal 207 of the imaging apparatus 100, and the wire 203.

The loop can capture an external magnetic field, which is formed of the above described power source supplying path, the reference voltage supplying path, the vertical output line 113, and the decoupling capacitor 311 on the packaging substrate. At this time, in the present embodiment, both of the fourth external connecting terminal 205 which supplies the power source voltage SVDD and the second external connecting terminal 207 which supplies the reference voltage AGND are positioned in the second direction with regard to the pixel region 110, and accordingly the area of this loop results in being small. Accordingly, the imaging apparatus can decrease the contamination of the noise which originates in the external magnetic field, and can reduce the noise which originates in the magnetic field incident externally.

Figure 6:
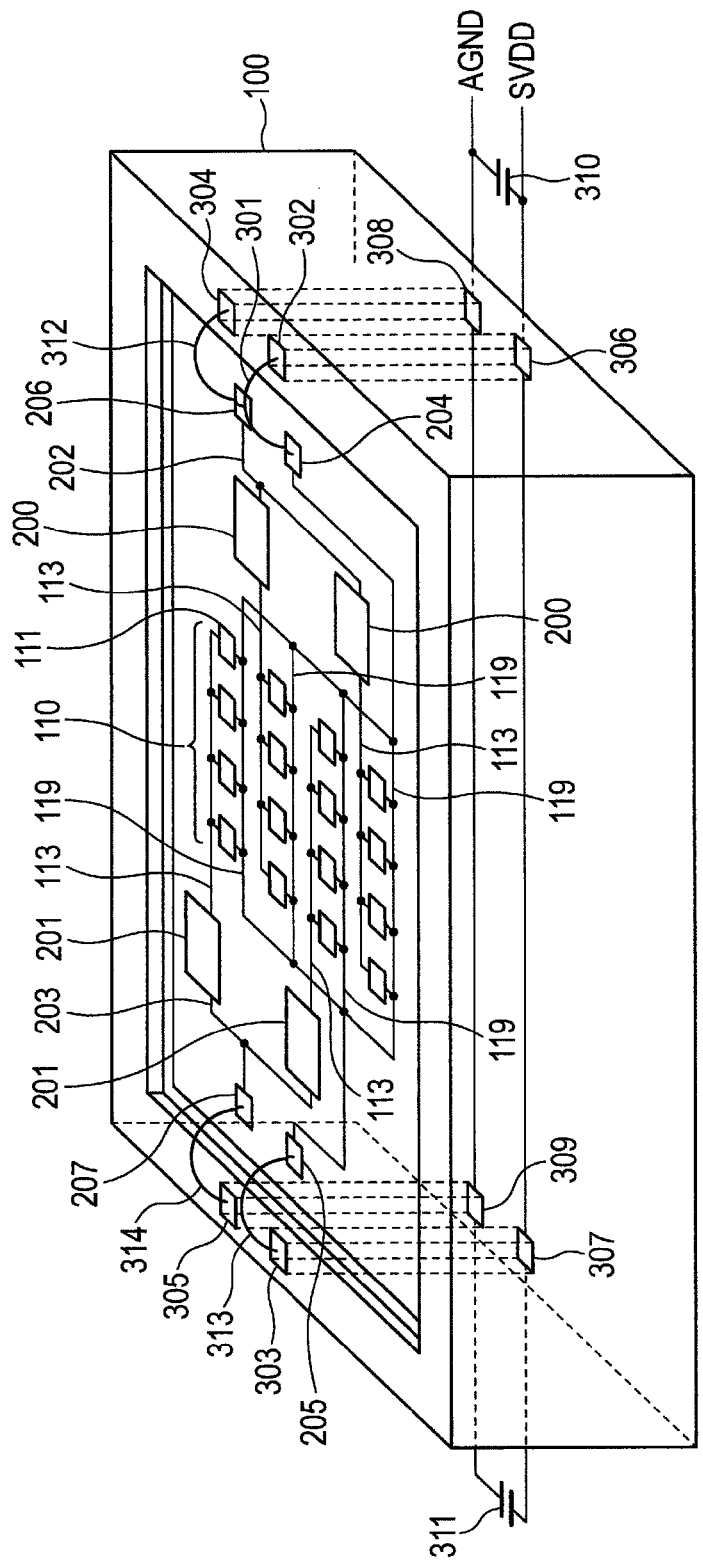
FIG. 6 is a schematic perspective view of an imaging apparatus.

FIG. 6 is a perspective view of an imaging apparatus 100 according to a comparative example, and is a view for describing the influence of the external magnetic field on the imaging apparatus 100. The analog signal processing circuit 200 is positioned in the first direction (right direction of FIG. 6) with regard to the pixel region 110, and signals of the pixels 111 in an odd-numbered column are input thereinto. To the pixels 111 in the odd-numbered column, the power source voltage SVDD is supplied not only from the third external connecting terminal 204 which is positioned in the first direction, but also from the fourth external connecting terminal 205 which is positioned in the second direction (left direction in FIG. 6). The imaging apparatus 100 according to the comparative example does not have the feature of the imaging apparatus 100 of the present embodiment in FIG. 5. As a result, in addition to the path which has been described in FIG. 5, the following loop is formed which can capture the external magnetic field. The loop is a loop formed of the wire 119, the fourth external connecting terminal 205, the connecting terminal 303 on the package side, the lands 307 and 306, the decoupling capacitor 310, the land 308, the connecting terminal 304 on the package side, the first external connecting terminal 206, the wire 202, and the vertical output line 113. Thereby, a loop having a large area results in being formed, and the noise originating in the external magnetic field results in being large.

The imaging apparatus 100 of the present embodiment in FIG. 5 can reduce the area of the loop which is formed by the node of the power source voltage SVDD for the pixels 111, and the node of the reference voltage AGND for the analog signal processing circuits 200 and 201, compared to that of the imaging apparatus 100 of FIG. 6. Thereby, the imaging apparatus 100 of the present embodiment can reduce the noise originating in the external magnetic field. The effect is large particularly on the imaging apparatus 100 which has the pixels 111 arrayed at a narrow pitch, and has the analog signal processing circuits 200 and 201 provided in two or more directions with regard to the pixel region 110.

Incidentally, in the present embodiment, the example has been described in which the pixels 111 in each of the columns are connected to one vertical output line 113. Another example is also acceptable in which a plurality of vertical output lines 113 are arranged for the pixels 111 in each of the columns, and the analog signal processing circuits 200 are provided in each of the vertical output lines 113.

A specific example thereof will be described below. In the pixels 111 in one column, one vertical output line 113 is connected to the pixels 111 in an odd-numbered row. On the other hand, another vertical output line 113 is connected to the pixels 111 in an even-numbered row. The analog signal processing circuit 200 that is arranged in the first direction with regard to the pixel region 110 is connected to the vertical output line 113 to which the pixels 111 in the odd-numbered row are connected. On the other hand, the analog signal processing circuit 200 that is arranged in the second direction with regard to the pixel region 110 is connected to the vertical output line 113 to which the pixels 111 in the even-numbered row are connected. Accordingly, the pixels 111 in the odd-numbered row are connected to the analog signal processing circuit 200 which is provided in the first direction with regard to the pixels 111 in one column, and the pixels 111 in the even-numbered row are connected to the analog signal processing circuit 200 which is provided in the second direction with regard to the pixels 111 in the column. To this analog signal processing circuit 200 which is connected to the pixels 111 in the odd-numbered row, the reference voltage AGND is supplied from the first external connecting terminal. On the other hand, to the analog signal processing circuit 200 which is connected to the pixels 111 in the even-numbered row, the reference voltage AGND is supplied from the second external connecting terminal. Thus, the present embodiment can also be applied to the case in which the plurality of vertical output lines 113 are provided for the pixels 111 in one column, and the analog signal processing circuit 200 is provided for each of the plurality of vertical output lines 113. In other words, the reference voltage AGND may be supplied to the analog signal processing circuit 200, from any one of the first external connecting terminal and the second external connecting terminal according to the direction in which the analog signal processing circuit 200 is provided with regard to the pixel region 110.

Incidentally, in the present embodiment, the example has been described in which a voltage to be supplied from external terminals which are different depending on whether the pixels 111 belong to the odd-numbered column or to the even-numbered column is the power source voltage SVDD. An example of another voltage will be described below.

For instance, in Japanese Patent Application Laid-Open No. 2010-178173, an imaging apparatus is disclosed in which a driving buffer which outputs a signal to a transfer switch of a pixel is arranged for each row of the pixels. Each of voltages of a low level and a high level is supplied to this driving buffer from a power source circuit. Suppose that two driving buffers which output a signal PTX1 to the pixels in one row are provided on such an imaging apparatus. In this case, in the imaging apparatus of the present embodiment, two driving buffers are provided for the pixels 111 in one row. One driving buffer out of the two driving buffers outputs a signal TX1 to the transfer switches 115 of the pixels 111 in an odd-numbered column. On the other hand, the other driving buffer outputs the signal TX1 to the transfer switches 115 of the pixels 111 in an even-numbered column. A terminal shall be referred to as the third external connecting terminal 204, which supplies voltages of a low level and a high level to the driving buffer that outputs the signal TX1 to the pixels 111 in the odd-numbered column. In addition, the terminal can be referred to as the fourth external connecting terminal 205, which supplies voltages of a low level and a high level to the driving buffer that outputs the signal TX1 to the pixels 111 in the even-numbered column. Here, the transfer line PTX has been described in the above, which is connected to the transfer switches 115 of the pixels 111, but the above example can be applied also to the reset line PRES and the row selecting line PSEL which are connected to the pixels 111.

Second Embodiment

Figure 7:
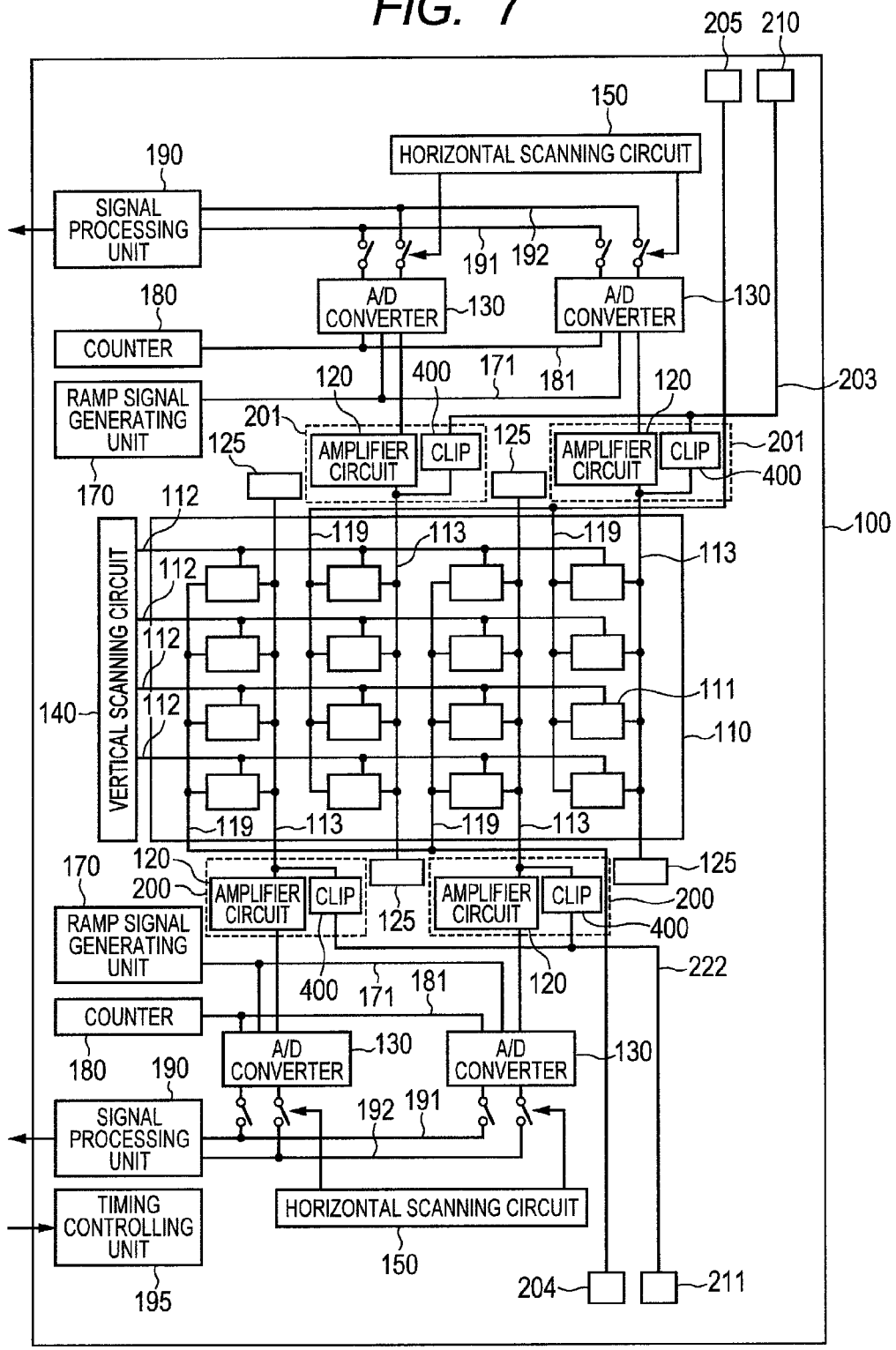
FIG. 7 is a schematic diagram illustrating an imaging apparatus of a second embodiment of the present invention.

FIG. 7 is a view illustrating a configuration example of an imaging apparatus 100 according to a second embodiment of the present invention. The imaging apparatus 100 (FIG. 7) of the present embodiment is different from the imaging apparatus 100 (FIG. 1) of the first embodiment, in analog signal processing circuits 200 and 201. The points will be described below in which the present embodiment is different from the first embodiment. The analog signal processing circuits 200 and 201 each have a clip circuit 400 in addition to the amplifying circuit 120. The clip circuit 400 performs processing of clipping a voltage of the vertical output line 113.

Figure 8:
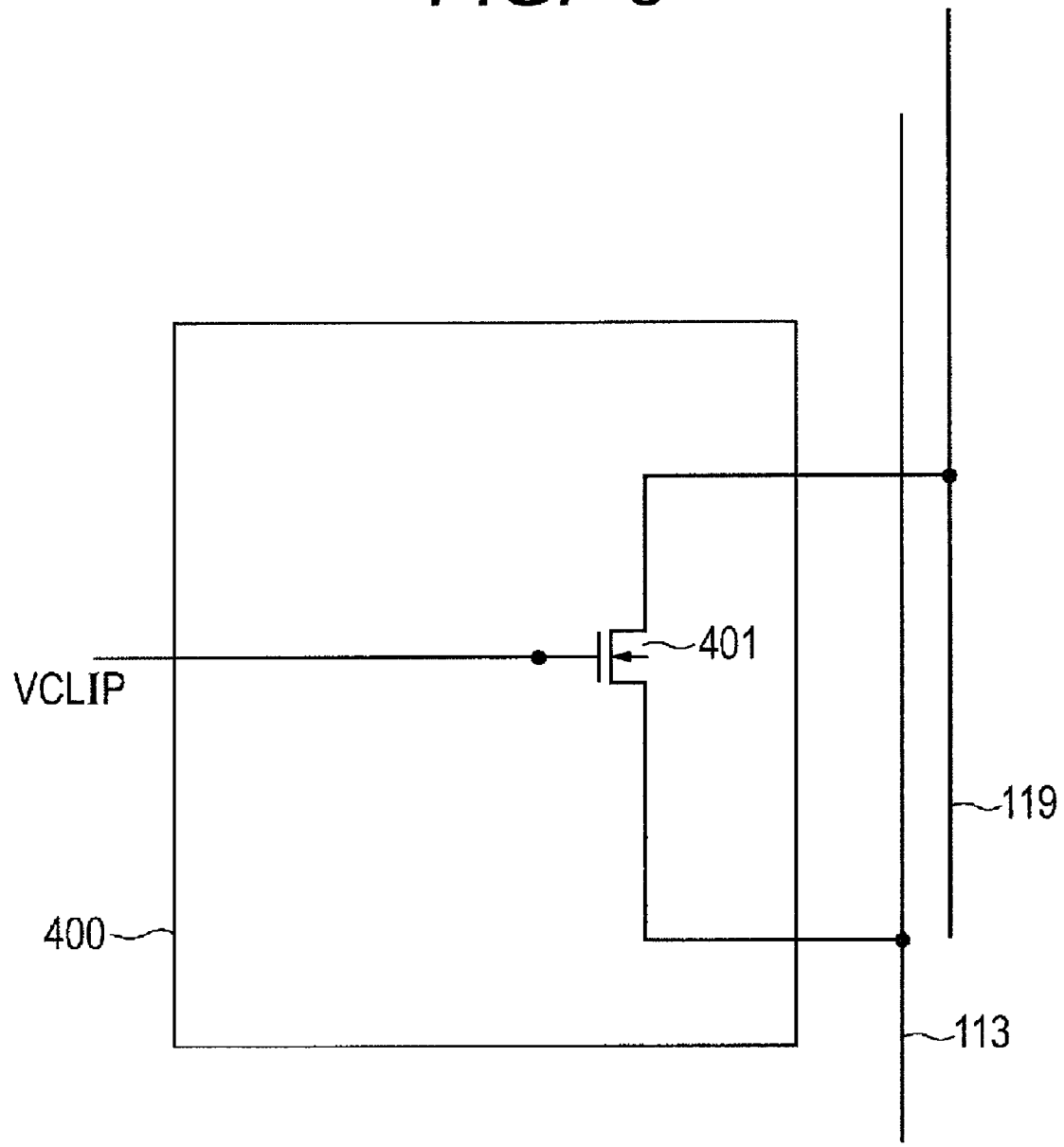
FIG. 8 is a circuit diagram of a clip circuit in the second embodiment of the present invention.

FIG. 8 is a circuit diagram illustrating a configuration example of the clip circuit 400. The clip circuit 400 has a clipping transistor 401. The drain of the clipping transistor 401 is connected to the node of the power source voltage SVDD through the wire 119. The source of the clipping transistor 401 is connected to the vertical output line 113. The gate of the clipping transistor 401 is connected to the node of a reference voltage VCLIP through a wire 222 or 203. Here, the amplifying transistor 117 in the pixel 111 in the selected row and the clipping transistor 401 operate as a source follower of which the sources are connected in common by the vertical output line 113. As a result, when the saturated amount of light is incident on the pixel 111, the potential of the vertical output line 113 is clipped by a potential which has been obtained by subtracting a voltage between the gate and the source of the clipping transistor 401 from the reference voltage VCLIP, and the clipping transistor 401 operates so that the potential does not become the clipping potential or lower. If there is not a clip circuit 400 and the saturated amount of light has been incident on the pixel 111, there is a possibility that the potential of the vertical output line 113 is excessively lowered, and that a malfunction occurs in the operation of the current source 125, but a saturated signal can be restricted with the use of the clip circuit 400.

Firstly, the analog signal processing circuit 200 in FIG. 7 will be described below. The analog signal processing circuit 200 has a first clip circuit 400 which receives a supply of the reference voltage VCLIP (FIG. 10) from a first external connecting terminal 211, and restricts a signal output from the pixel 111 in an odd-numbered column. The first clip circuit 400 has a first transistor 401, and the gate of the first transistor 401 is connected to the first external connecting terminal 211.

Next, the analog signal processing circuit 201 in FIG. 7 will be described. The analog signal processing circuit 201 has a second clip circuit 400 which receives a supply of the reference voltage VCLIP (FIG. 10) from a second external connecting terminal 210, and restricts a signal output from the pixel 111 in an even-numbered column. The second clip circuit 400 has a second transistor 401, and the gate of the second transistor 401 is connected to the second external connecting terminal 210.

Figure 10:
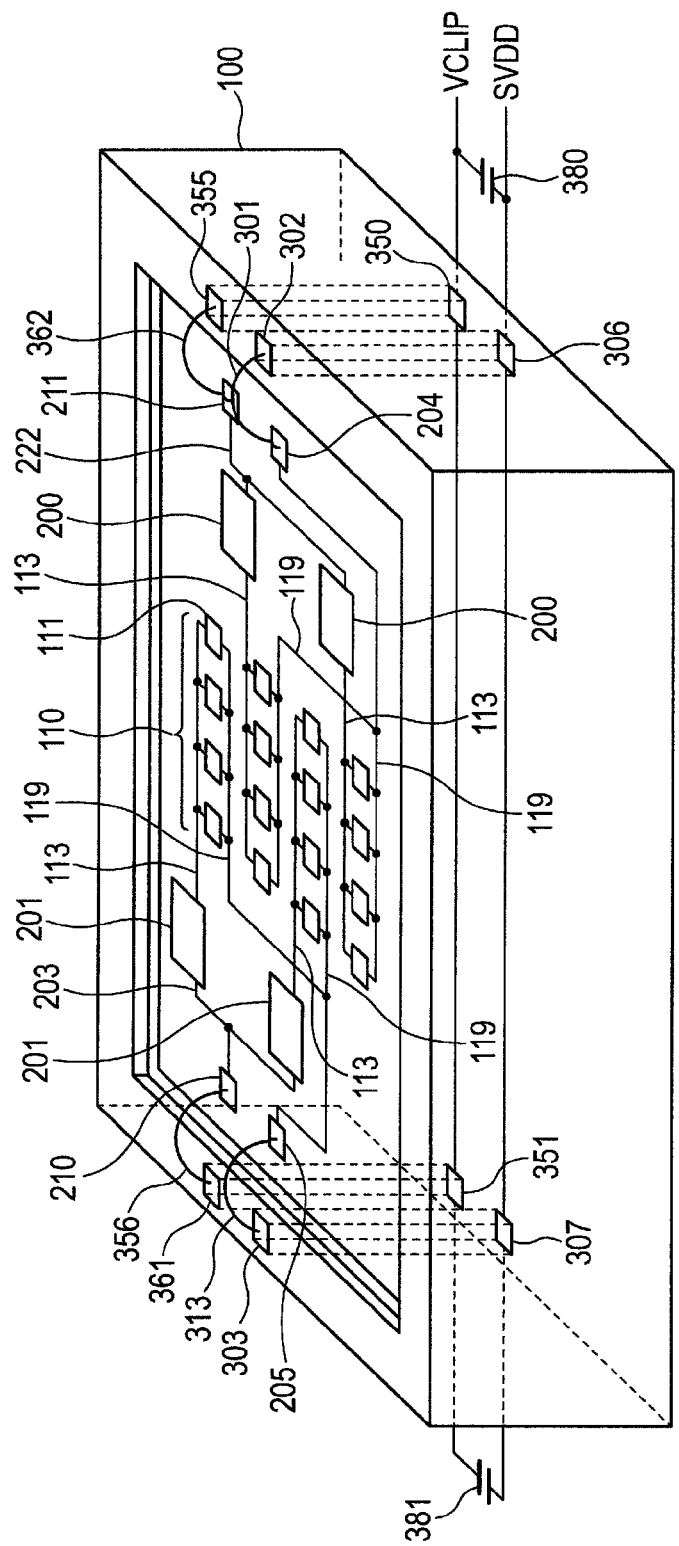
FIG. 10 is a schematic perspective view of another imaging apparatus of the present invention.

FIG. 10 is a perspective view of the imaging apparatus 100 according to the present embodiment, and is a view for describing an influence of an external magnetic field on the imaging apparatus 100. Members having the same functions as those in FIG. 5 are designated by the reference numerals designated in FIG. 5, also in FIG. 10. The reference voltage VCLIP is connected to the first external connecting terminal 211 from the outside of the imaging apparatus 100, through a land 350, a through-via, a connecting terminal 355 on the package side, and a bonding wire 362. In addition, the reference voltage VCLIP is connected to the second external connecting terminal 210 from the outside of the imaging apparatus 100, through a land 351, a through-via, a connecting terminal 361 on the package side, and a bonding wire 356. A decoupling capacitor 380 is connected in between a wiring pattern through which the power source voltage SVDD is supplied to the land 306, and a wiring pattern through which the reference voltage VCLIP is supplied to the land 350. The decoupling capacitor 381 is connected in between the lands 307 and 351, and a potential difference between the power source voltage SVDD and the reference voltage VCLIP is charged in the decoupling capacitor.

As has been described above, in the imaging apparatus 100 in FIG. 6, a large loop is formed which is formed by the node of the reference voltage VCLIP and the node of the power source voltage SVDD and captures a magnetic field. Because of this, when the noise originating in the magnetic field is observed as a fluctuation of the saturated signal and the potential of the vertical output line 113 becomes excessively low, there is a possibility that the noise causes an operation failure of the current source 125. On the contrary, when the potential of the vertical output line 113 becomes excessively high, the saturated signal is lowered, and there is a possibility that such a malfunction occurs that the dynamic range is lowered. In contrast to this, according to the imaging apparatus 100 of the second embodiment, as is illustrated in FIG. 5, the area of the loop becomes small which is formed by the node of the reference voltage VCLIP and the node of the power source voltage SVDD and captures a magnetic field, and accordingly the fluctuation of the saturated signal due to the magnetic field can be reduced, and an adequate photoelectrically converted signal is obtained.

Third Embodiment

Figure 11:
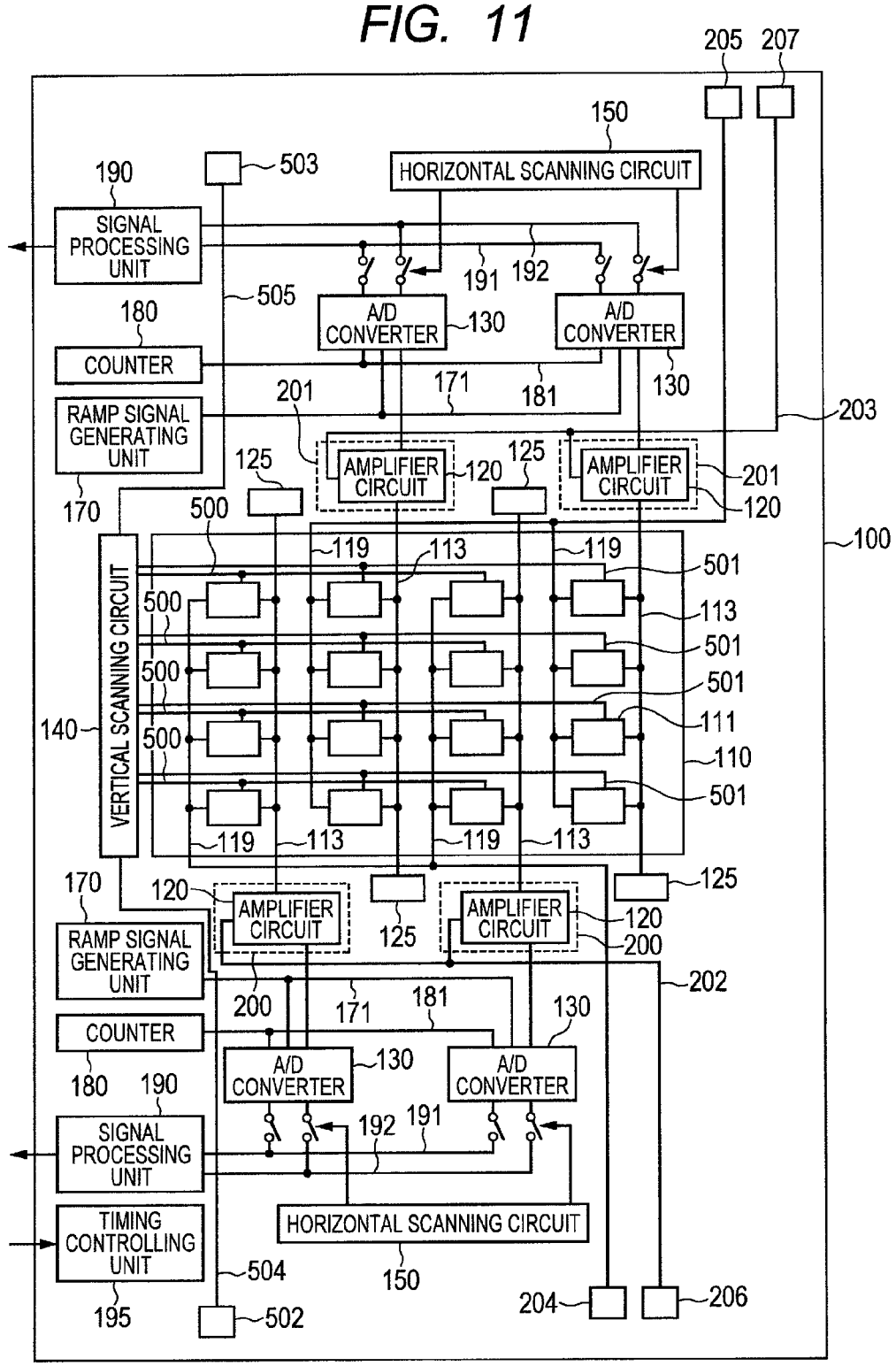
FIG. 11 is a schematic diagram illustrating an imaging apparatus of a third embodiment of the present invention.

FIG. 11 is a view illustrating a configuration example of an imaging apparatus 100 according to a third embodiment of the present invention. The imaging apparatus 100 (FIG. 11) of the present embodiment is an apparatus in which row selecting lines 500 and 501 are provided in place of the row selecting line 112 of the imaging apparatus 100 (FIG. 1) of the first embodiment, and external connecting terminals 502 and 503 are added thereto. The row selecting lines 500 and 501 each contain the reset line PRES, the transfer line PTX and the row selecting line PESEL, similarly to the row selecting line 112 in FIG. 3. An external connecting terminal 502 is connected to the vertical scanning circuit 140 through a wire 504. An external connecting terminal 503 is connected to the vertical scanning circuit 140 through a wire 505. The points will be described below in which the present embodiment is different from the first embodiment.

The pixels 111 in each of the rows have pixels (first group of pixels) 111 in an odd-numbered column and pixels (second group of pixels) 111 in an even-numbered column. The row selecting line 500 is connected to the pixels (first group of pixels) 111 in the odd-numbered column. The pixels 111 in the odd-numbered column are connected to an amplifying circuit 120 in a first direction (lower direction in FIG. 11) through the vertical output line 113. The row selecting line 501 is connected to the pixels (second group of pixels) 111 in the even-numbered column. The pixels 111 in the even-numbered column are connected to an amplifying circuit 120 in a second direction (upper direction in FIG. 11) through the vertical output line 113.

The external connecting terminal 502 is arranged in the first direction (lower direction in FIG. 11) with regard to the pixel region 110. The external connecting terminal 503 is arranged in the second direction (upper direction in FIG. 11) with regard to the pixel region 110. A low-level power source voltage (second potential) (FIG. 14) VRESL which is supplied to the row selecting lines 500 and 501 is supplied to the external connecting terminals 502 and 503. The low-level power source voltage VRESL is supplied to the external connecting terminals 502 and 503 on the packaging substrate, through lands which are electrically connected to the low-level power source voltage VRESL, similarly to the power source voltage SVDD (FIG. 5) in the first embodiment. As for the feature of the present embodiment, the external connecting terminal 502 is a terminal positioned in a side close to the analog signal processing circuit 200, and the external connecting terminal 503 is a terminal positioned in a side close to the analog signal processing circuit 201.

Figure 12:
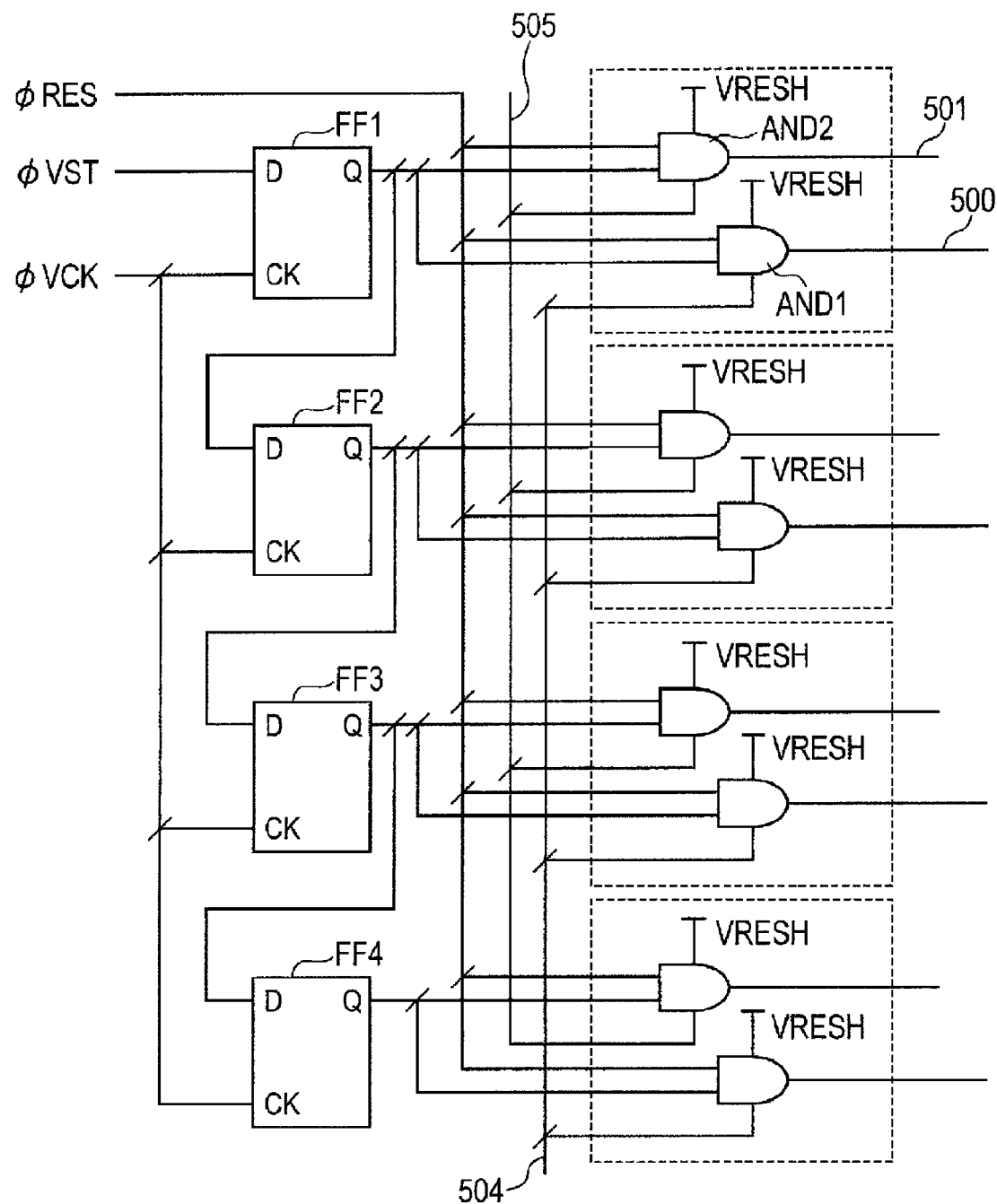
FIG. 12 is a view illustrating a configuration example of a vertical scanning circuit.

FIG. 12 is a view illustrating a configuration example of a vertical scanning circuit 140 in FIG. 11. The row selecting lines 500 and 501 each contain the reset line PRES, the transfer line PTX and the row selecting line PSEL, similarly to the row selecting line 112 in FIG. 3, but here, a configuration example of the reset line PRES will be representatively described below. Other transfer line PTX and row selecting line PSEL are also similar to the above example. A first AND-circuit (first driving buffer) AND1 and a second AND-circuit (second driving buffer) AND2 are provided so as to correspond to each row, respectively.

The vertical scanning circuit 140 has a shift register which is formed of flip-flops FF1 to FF4 so as to sequentially shift each of the plurality of row selecting lines 500 and 501. The flip-flop FF1 receives an input clock signal φVCK at a clock terminal CK, receives an input signal φVST at an input terminal D, and outputs an output signal from an output terminal Q. The flip-flop FF2 receives the input clock signal φVCK at the clock terminal CK, receives the input signal which has been output from the flip-flop FF1 at the input terminal D, and outputs an output signal from the output terminal Q. The flip-flop FF3 receives the input clock signal φVCK at the clock terminal CK, receives the input signal which has been output from the flip-flop FF2 at the input terminal D, and outputs an output signal from the output terminal Q. The flip-flop FF4 receives the input clock signal φVCK at the clock terminal CK, receives the input signal which has been output from the flip-flop FF3 at the input terminal D, and outputs an output signal from the output terminal Q.

The AND-circuit AND1 in each row outputs an AND-signal of a reset pulse φRES which is given from the outside and the signal which is output from the flip-flops FF1 to FF4 in each row, to the row selecting line 500. The AND-circuit AND2 in each row outputs an AND-signal of a reset pulse φRES which is given from the outside and the signal which is output from the flip-flops FF1 to FF4 in each row, to the row selecting line 501.

Thereby, only the pixels 111 in the row of the row selecting lines 500 and 501 (reset line PRES) which are selected by the shift register are reset in some one horizontal period. Incidentally, here, the vertical scanning circuit 140 is described so as to have such a configuration that the shift register which is an order circuit controls the selection of arbitrary one or a plurality of rows, but the configuration of the vertical scanning circuit 140 is not limited to this configuration, and the vertical scanning circuit 140 may be configured so that a decoder circuit, for instance, controls the selection.

The AND-circuits AND1 and AND2 receive a supply of a high-level power source voltage VRESH. In addition, the AND-circuit AND1 receives a supply of a low-level power source voltage VRESL from the external connecting terminal 502 through the wire 504. The AND-circuit AND2 receives a supply of the low-level power source voltage VRESL from the external connecting terminal 503 through the wire 505. Each of the AND-circuits AND1 and AND2 outputs the high-level power source voltage VRESH or the low-level power source voltage VRESL according to the AND-state of the input signal. In addition, as has been described in FIG. 4, in the period during which the signal of the pixel 111 is read out, the reset line PRES outputs the low-level power source voltage. In other words, the reset line PRES becomes the low-level power source voltage VRESL.

Here, the low-level power source voltage which is the signal output from the AND-circuit AND1 is the low-level power source voltage VRESL which is supplied from the external connecting terminal 502 through the wire 504. In addition, the low-level power source voltage which is the signal output from the AND-circuit AND2 is the low-level power source voltage VRESL which is supplied from the external connecting terminal 503 through the wire 505.

In other words, in the period during which the signal of the pixel 111 is read out, the low-level power source voltage VRESL which is supplied from the external connecting terminal 503 through the wire 505 is supplied to the row selecting line 501. In addition, the low-level power source voltage VRESL which is supplied from the external connecting terminal 502 through the wire 504 is supplied to the row selecting line 500. The row selecting line 501 is connected to the pixels (second group of pixels) 111 in the even-numbered column. The row selecting line 500 is connected to the pixels (first group of pixels) 111 in the odd-numbered column.

Figure 13:
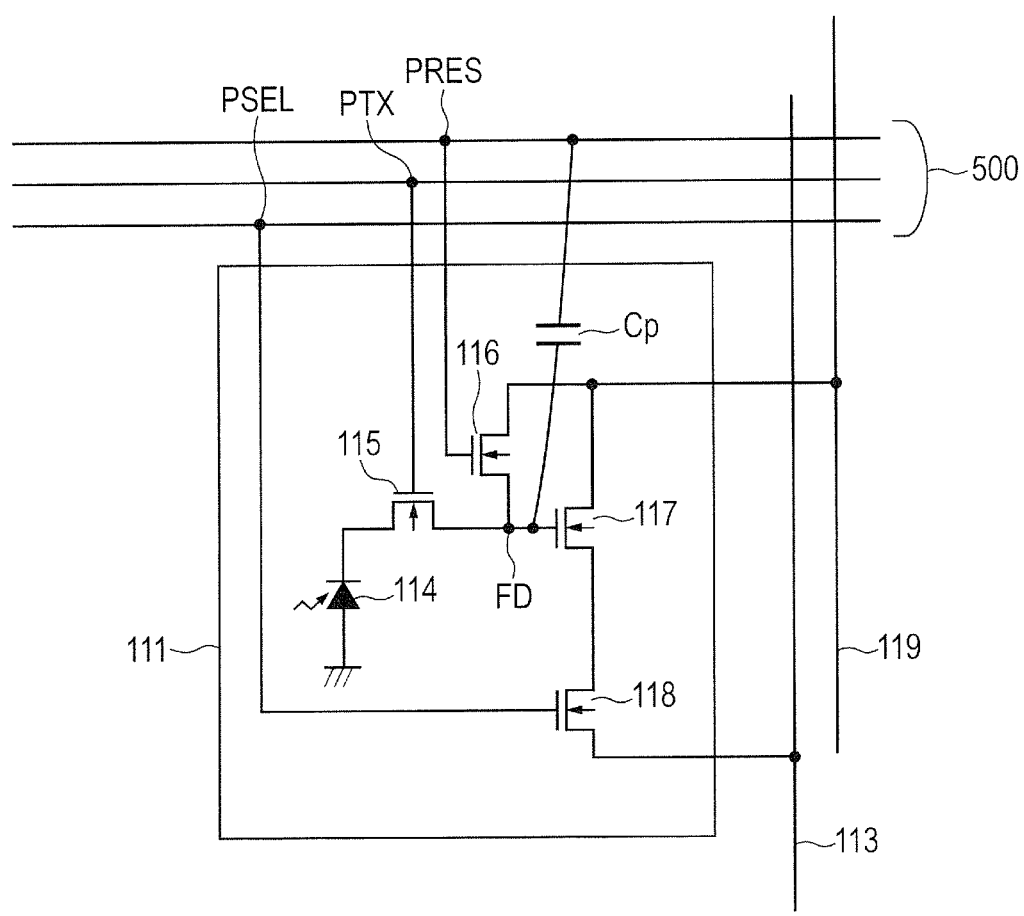
FIG. 13 is a circuit diagram of a pixel in the third embodiment of the present invention.

By the way, a parasitic capacitor which is formed by the floating diffusion FD and the wire actually exists around the floating diffusion FD in the circuit diagram of the pixel 111 in FIG. 3 illustrated in the first embodiment. A view in which the parasitic capacitor Cp is illustrated is FIG. 13. The reset line PRES in each of the row selecting lines 500 and 501 is connected to the floating diffusion FD through the parasitic capacitor Cp. Thereby, a closed loop is formed that contains a supplying wire of the low-level power source voltage VRESL which is supplied to the vertical scanning circuit, and a supplying wire of the reference voltage AGND which is supplied to the analog signal processing circuits 200 and 201.

Figure 14:
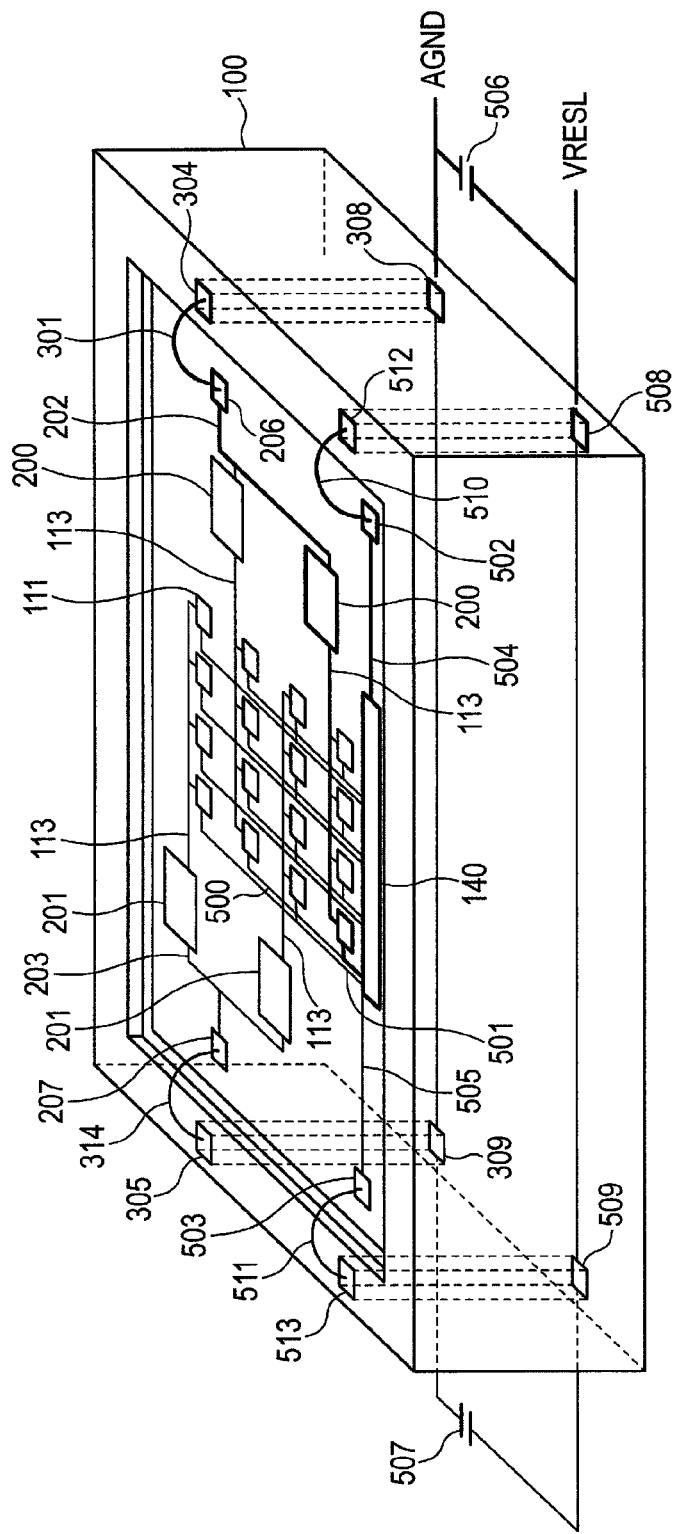
FIG. 14 is a schematic perspective view of the imaging apparatus of the third embodiment of the present invention.

FIG. 14 illustrates a perspective view of the imaging apparatus 100, which contains this closed loop. The points will be described below in which the perspective view of the imaging apparatus 100 of the present embodiment (FIG. 14) is different from the perspective view of the imaging apparatus 100 of the first embodiment (FIG. 5). In FIG. 14, connecting terminals 512 and 513 on the package side, lands 508 and 509 in the package, and decoupling capacitors 506 and 507 are added to FIG. 5. The decoupling capacitors 506 and 507 are decoupling capacitors in between the reference voltage AGND and the low-level power source voltage VRESL. The decoupling capacitor 506 is connected between the lands 308 and 508. The decoupling capacitor 507 is connected between the lands 309 and 509.

The low-level power source voltage VRESL is supplied to the land 508. The land 508 is connected to the connecting terminal 512 on the package side through a through-via (shown by dotted line). The connecting terminal 512 on the package side is connected to the external connecting terminal 502 through a bonding wire 510. The land 509 is connected to the land 508. In addition, the land 509 is connected to the connecting terminal 513 on the package side through a through-via (shown by dotted line). The connecting terminal 513 on the package side is connected to the external connecting terminal 503 through a bonding wire 511.

Incidentally, the imaging apparatus in FIG. 14 has also the lands 306 and 307, the through-via (shown by dotted line), the connecting terminals 302 and 303 on the package side, the bonding wires 301 and 313, the external connecting terminals 204 and 205, and the wire 119, which are supply lines of the power source voltage SVDD in FIG. 5, similarly to FIG. 5.

In such a configuration, a closed loop shown by the thick line, which contains the analog signal processing circuit 200 that is arranged in the first direction, becomes as follows. The loop starts from the reference voltage AGND, and progresses to the decoupling capacitor 506, the wire of the low-level power source voltage VRESL, the land 508, the through-via (shown by dotted line), the connecting terminal 512 on the package side, the bonding wire 510 and the external connecting terminal 502. Subsequently, the loop progresses to the wire 504 (which contains also the inside of vertical scanning circuit 140), the row selecting line 500 (which contains also the inside of vertical scanning circuit 140), the pixel 111, the parasitic capacitor Cp, the floating diffusion FD, the vertical output line 113 and the analog signal processing circuit 200. Subsequently, the loop progresses to the wire 202, the external connecting terminal 206, the bonding wire 301, the connecting terminal 304 on the package side, the through-via (shown by dotted line) and the land 308. Thus, the closed loop is formed.

In addition, a closed loop of the analog signal processing circuit 201 which is arranged in the second direction becomes as follows. The loop starts from the reference voltage AGND, and progresses to the decoupling capacitor 507, the land 509, the through-via (shown by dotted line), the connecting terminal 513 on the package side, the bonding wire 511 and the external connecting terminal 503. Subsequently, the loop progresses to the wire 505 (which contains also the inside of vertical scanning circuit 140), the row selecting line 501 (which contains also the inside of vertical scanning circuit 140), the pixel 111, the parasitic capacitor Cp, the floating diffusion FD, the vertical output line 113 and the analog signal processing circuit 201. Subsequently, the loop progresses to the wire 203, the external connecting terminal 207, the bonding wire 314, the connecting terminal 305 on the package side, the through-via (shown by dotted line) and the land 309. Thus, the closed loop is formed.

An external magnetic field which has been captured by the above described closed loop is observed as noise. In the present embodiment, the external connecting terminal 502 to which the low-level power source voltage VRESL is supplied is provided in the right side in FIG. 14, which is the same side as the external connecting terminal 206 that supplies the reference voltage AGND. In addition, the external connecting terminal 503 to which the low-level power source voltage VRESL is supplied is provided in the left side in FIG. 14, which is the same side as the external connecting terminal 207 that supplies the reference voltage AGND. Thereby, in the present embodiment, similarly to the first embodiment, the area of the closed loop becomes small and the contamination of the noise becomes little which originates in the external magnetic field, compared to the case of the closed loop similar to that in FIG. 6. Consequently, the imaging apparatus can reduce the noise which originates in the magnetic field incident externally.

Incidentally, as for the high-level power source voltage VRESH in FIG. 12, there is no devise for separating the external connecting terminal. This is because the reset operation for the pixel 111 is not performed at such a timing that the signal of the pixel 111 is read out, the low-level power source voltage VRESL is output to the reset line PRES, and accordingly the high-level power source voltage VRESH does not form the loop when the signal is read out. If the positive and the negative of the logic of the transistor in the pixel 111 is reverse, and the high-level power source voltage VRESH is output to the reset line PRES at the time when the pixel 111 is not reset, the external connecting terminal and the wire of the high-level power source voltage VRESH need to be separately provided.

In addition, concerning also other control lines for driving the pixels 111 such as the transfer line PTX and the row selecting line PSEL, a similar countermeasure to that for the low-level power source voltage VRESL, which has been described in the above description, can be performed for the power source voltage that is used when the signal of the pixel 111 is read out, in consideration of the positive and the negative of the logic. Thereby, a similar effect can be obtained.

Fourth Embodiment

An imaging apparatus 100 according to a fourth embodiment of the present invention has the same configuration as that in FIG. 11, and has a different internal configuration of the vertical scanning circuit 140 from that in the imaging apparatus 100 of the third embodiment. The internal configuration of the vertical scanning circuit 140 of the present embodiment will be described below, which is different from that of the third embodiment.

Figure 15:
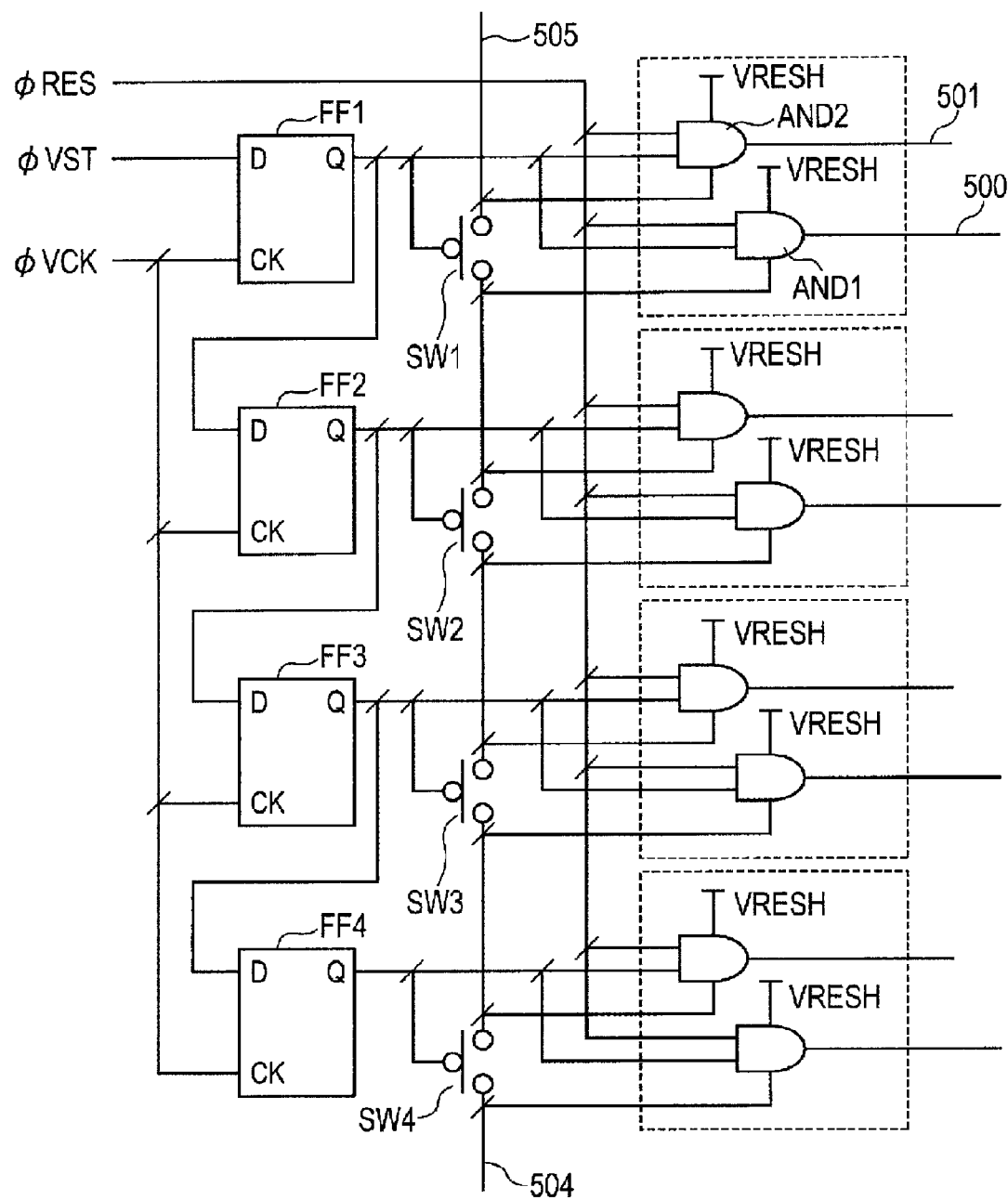
FIG. 15 is a view illustrating a configuration example of a vertical scanning circuit in a fourth embodiment of the present invention.

FIG. 15 is a view illustrating a configuration example of the vertical scanning circuit 140 according to the fourth embodiment of the present invention. The vertical scanning circuit 140 in FIG. 15 is a circuit in which switches SW1 to SW4 are added to the vertical scanning circuit 140 in FIG. 12. The switches SW1 to SW4 are connected in series between the wires 504 and 505, and operate according to a negative logic. The points will be described below in which the vertical scanning circuit 140 in FIG. 15 is different from the vertical scanning circuit 140 in FIG. 12.

When the signal of the output terminal Q in the flip-flop FF1 becomes a high level, and the signals of the output terminals Q in the flip-flops FF2 to FF4 become a low level, for instance, the vertical scanning circuit 140 becomes a state of selecting the first row. In this case, the switch SW1 is in an OFF state, and the switches SW2 to SW4 are in an ON state. Because of this, the connection between the wires 504 and 505 is cut at a portion of the switch SW1. The AND-circuit AND1 in the first row receives a supply of the low-level power source voltage VRESL from the wire 504, and the AND-circuit AND2 in the first row receives a supply of the low-level power source voltage VRESL from the wire 505.

Subsequently, when the selected row is shifted by one row by the clock signal φVCK, the output terminal Q in the flip-flop FF2 becomes a high level, and the output terminals Q in the flip-flops FF1, FF3 and FF4 become a low level, the vertical scanning circuit 140 becomes a state of selecting the second row. In this case, the switch SW2 is in the OFF state, and the switches SW1, SW3 and SW4 are in the ON state. Because of this, the connection between the wires 504 and 505 is cut at a portion of the switch SW2. The AND-circuit AND1 in the second row receives a supply of the low-level power source voltage VRESL from the wire 504, and the AND-circuit AND2 in the second row receives a supply of the low-level power source voltage VRESL from the wire 505.

Subsequently, when the selected row is shifted by one row by the clock signal φVCK, the output terminal Q of the flip-flop FF3 becomes a high level, and the output terminals Q of the flip-flops FF1, FF2 and FF4 become a low level, the vertical scanning circuit 140 becomes a state of selecting the third row. In this case, the switch SW3 is in the OFF state, and the switches SW1, SW2 and SW4 are in the ON state. Because of this, the connection between the wires 504 and 505 is cut at a portion of the switch SW3. The AND-circuit AND1 in the third row receives a supply of the low-level power source voltage VRESL from the wire 504, and the AND-circuit AND2 in the third row receives a supply of the low-level power source voltage VRESL from the wire 505.

Subsequently, when the selected row is shifted by one row by the clock signal φVCK, the output terminal Q of the flip-flop FF4 becomes a high level, and the output terminals Q of the flip-flops FF1 to FF3 become a low level, the vertical scanning circuit 140 becomes a state of selecting the fourth row. In this case, the switch SW4 is in the OFF state, and the switches SW1 to SW3 are in the ON state. Because of this, the connection between the wires 504 and 505 is cut at a portion of the switch SW4. The AND-circuit AND1 in the fourth row receives a supply of the low-level power source voltage VRESL from the wire 504, and the AND-circuit AND2 in the fourth row receives a supply of the low-level power source voltage VRESL from the wire 505.

When such an operation is performed, the switch SW in the selected row is turned off, and the connection between the wires 504 and 505 is cut. Because of this, the low-level power source voltage VRESL of the AND-circuit AND1 in the selected row is the low-level power source voltage VRESL which is supplied from the external connecting terminal 502 through the wire 504. In addition, the low-level power source voltage VRESL of the AND-circuit AND2 in the selected row is the low-level power source voltage VRESL which is supplied from the external connecting terminal 503 through the wire 505.

The plurality of switches SW1 to SW4 are provided so as to correspond to each of the rows, and are connected between the external connecting terminal 502 and the external connecting terminal 503. As has been described above, among the plurality of switches SW1 to SW4, a switch of one selected row is turned off, and the other switches are turned on. In the one selected row, the AND-circuit AND1 does not receive a supply of the low-level power source voltage VRESL from the external connecting terminal 503, but receives a supply of the low-level power source voltage VRESL from the external connecting terminal 502. In addition, the AND-circuit AND2 does not receive a supply of the low-level power source voltage VRESL from the external connecting terminal 502, but receives a supply of the low-level power source voltage VRESL from the external connecting terminal 503.

In the present embodiment, the AND-circuits AND1 and AND2 in the selected row receive a supply of the low-level power source voltage VRESL from the wires 504 and 505, respectively, through the same path as that in the third embodiment. Accordingly, the imaging apparatus according to the present embodiment can also reduce the area of the closed loop, accordingly can decrease the contamination of the noise which originates in the external magnetic field, and can reduce the noise which originates in the magnetic field incident externally, similarly to the third embodiment (FIG. 14).

Fifth Embodiment

Figure 16:
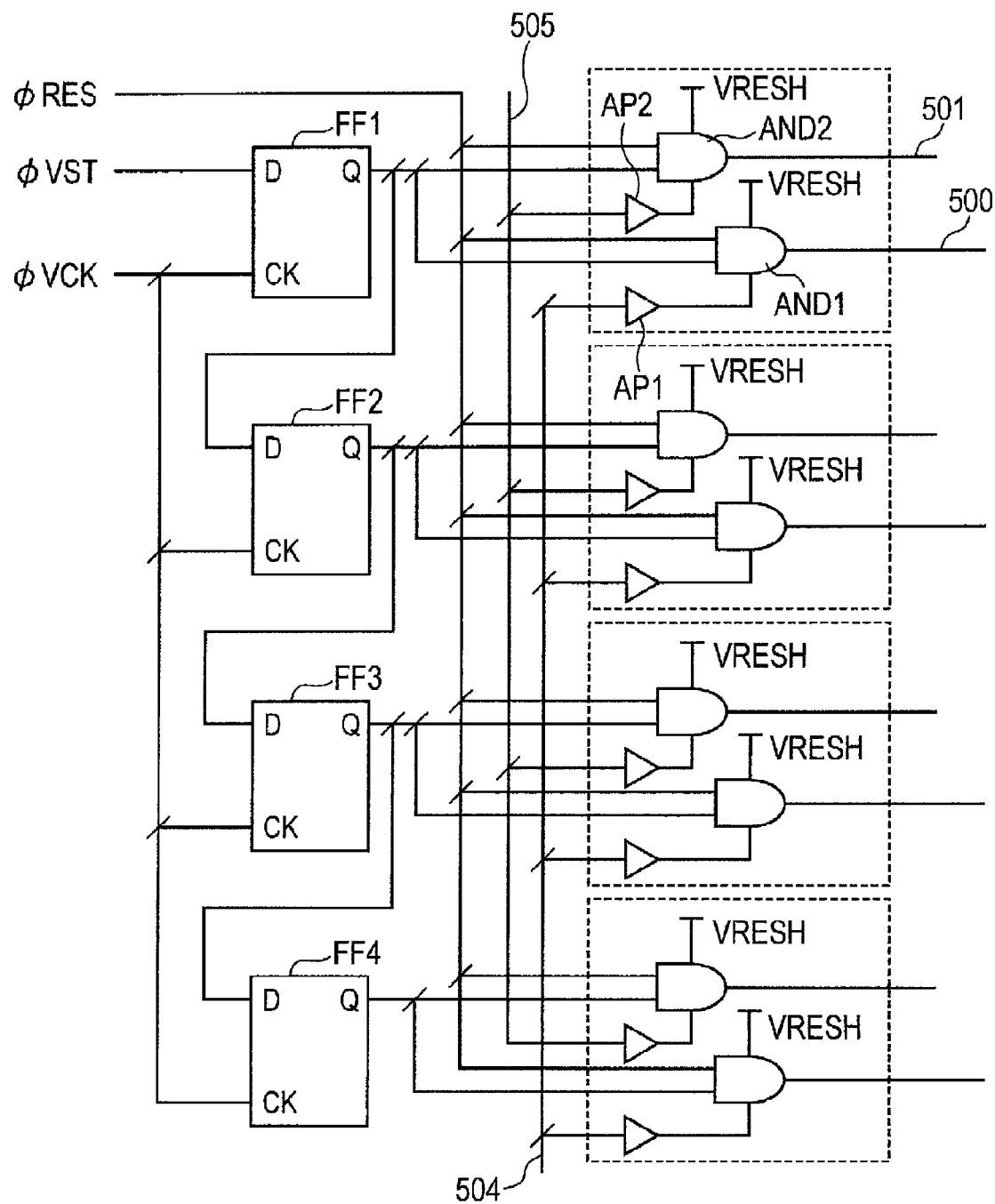
FIG. 16 is a view illustrating a configuration example of a vertical scanning circuit in a fifth embodiment of the present invention.

FIG. 16 is a view illustrating a configuration example of a vertical scanning circuit 140 according to a fifth embodiment of the present invention. The vertical scanning circuit 140 (FIG. 16) of the present embodiment is a circuit in which amplifying circuits AP1 and AP2 in each of the rows are added to the vertical scanning circuit 140 (FIG. 12) of the third embodiment. The points will be described below in which the present embodiment is different from the third embodiment.

The first amplifying circuit AP1 in each of the rows amplifies an alternating noise component which is superimposed on the low-level power source voltage VRESL that is supplied from the external connecting terminal 502 through the wire 504, and outputs the result to the AND-circuit AND1 in each of the rows. The second amplifying circuit AP2 in each of the rows amplifies an alternating noise component which is superimposed on the low-level power source voltage VRESL that is supplied from the external connecting terminal 503 through the wire 505, and outputs the result to the AND-circuit AND2 in each of the rows. In the amplifying circuits AP1 and AP2, the circuit constant is designed so that the amplitude of the alternating current (AC) component of the noise which originates in the external magnetic field is amplified and the phase thereof is adjusted, while the direct current (DC) voltage level of the low-level power source voltage VRESL is kept. When the amplifying circuits AP1 and AP2 adjust the amplitude and the phase of the alternating component, a noise for offsetting another component of a propagation path of the external magnetic noise can be superimposed on the potential of the row selecting line 500 or 501. Thereby, the imaging apparatus 100 can offset the external magnetic noise, and can reduce an influence of the external magnetic noise, as a whole.

In the first embodiment, for instance, the noise component can be reduced which gets mixed in the loop of the power source voltage SVDD. In the third to fifth embodiments, the noise component can be reduced which gets mixed in the loop of the low-level power source voltage VRESL. By combining both of the embodiments with one another, the noise components can be reduced which get mixed in both of the loops. Furthermore, according to the present embodiment, the amplifying circuits AP1 and AP2 equalize the amplitude of the noise component which gets mixed in the loop of the low-level power source voltage VRESL with the amplitude of the noise component which gets mixed in the loop of the power source voltage SVDD. In addition, the amplifying circuits AP1 and AP2 shift the phase of the noise component which gets mixed in the loop of the low-level power source voltage VRESL by 180 degrees, with respect to the phase of the noise component which gets mixed in the loop of the power source voltage SVDD. Thereby, the amplifying circuits can offset the noise component which gets mixed in the loop of the low-level power source voltage VRESL, by the noise component which gets mixed in the loop of the power source voltage SVDD. Thus, the amplifying circuits AP1 and AP2 adjust the amplitude and the phase so that the noise components which get mixed in each of the loops are offset by each other, and thereby the imaging apparatus 100 can reduce the influence of the external magnetic noise as a whole.

The amplifying circuit AP1 adjusts at least one of the amplitude and the phase of the alternating component of the low-level power source voltage VRESL at the external connecting terminal 502, and outputs the result to the AND-circuit AND1. The amplifying circuit AP2 adjusts at least one of the amplitude and the phase of the alternating component of the low-level power source voltage VRESL at the external connecting terminal 503, and outputs the result to the AND-circuit AND2. The amplifying circuits AP1 and AP2 adjust at least any one of the amplitude and the phase of the above described alternating component so that a noise which gets mixed in the loop of the power source voltage SVDD formed by the external connecting terminal 204 and a noise which gets mixed in the loop of the power source voltage SVDD formed by the external connecting terminal 205 offset each other.

Incidentally, the amplifying circuits AP1 and AP2 can also be added to the vertical scanning circuit 140 (FIG. 15) of the fourth embodiment, similarly to the present embodiment. In addition, in the present embodiment, the example has been described in which the amplifying circuits AP1 and AP2 are provided in each of the rows, but the amplifying circuits AP1 and AP2 may be shared by a plurality of the rows in a range in which an influence of an external magnetic noise is allowable. The amplifying circuits AP1 and AP2 can employ a standard amplifying circuit which is usually used.

Sixth Embodiment

Figure 9:
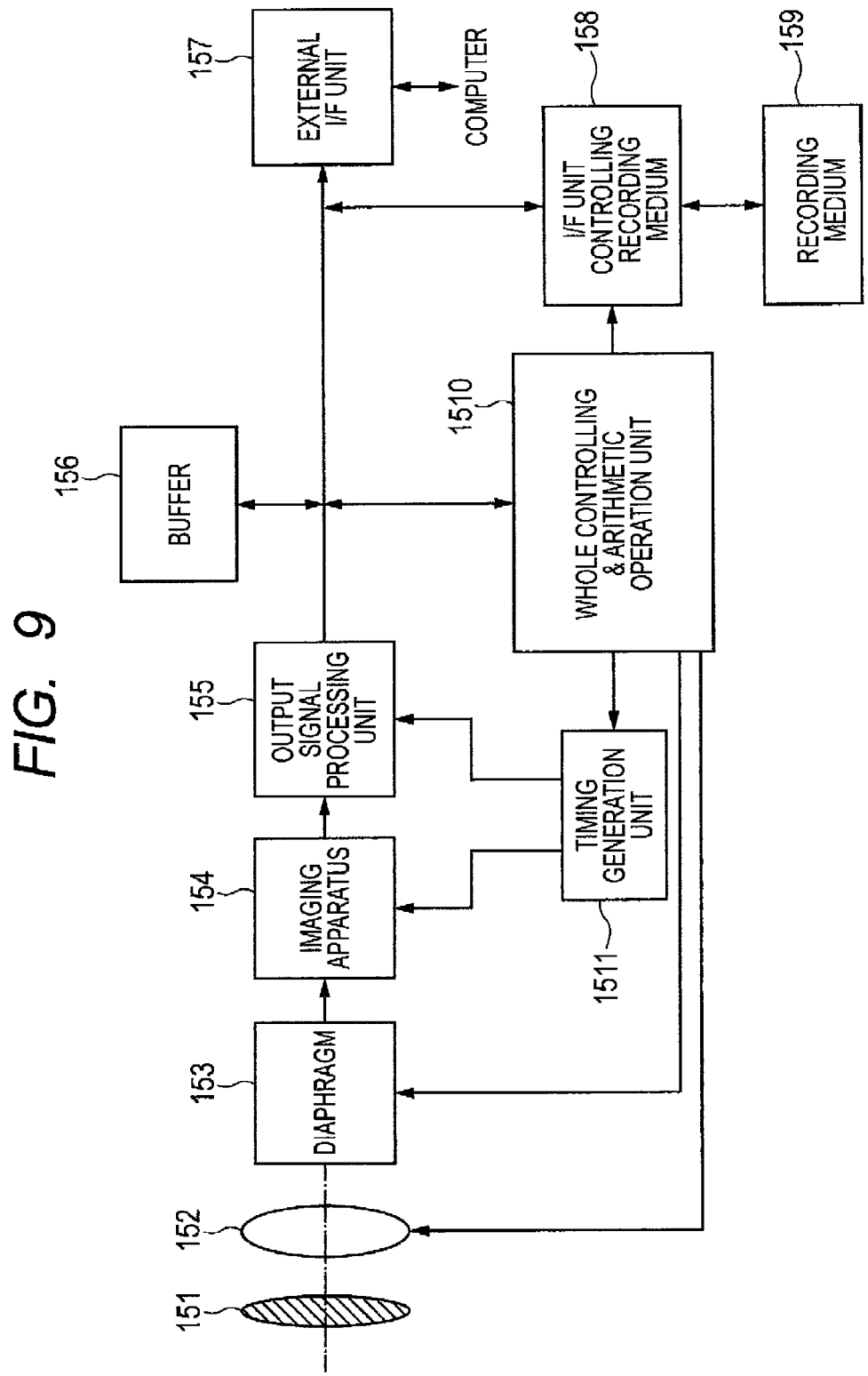
FIG. 9 is a view illustrating a configuration example of an imaging system.

The imaging apparatus 100 which has been described in the above described first to fifth embodiments can be applied to various imaging systems. The imaging systems include a digital still camera, a digital camcorder and a monitoring camera, as an example. FIG. 9 illustrates a view of an imaging system in which any one of the imaging apparatuses 100 of the first to fifth embodiments of the present invention is applied to the digital still camera, as an example of the imaging system.

The imaging system illustrated in FIG. 9 has an imaging apparatus 154, a barrier 151 for protecting a lens 152, the lens 152 which images an optical image of an object on the imaging apparatus 154, and a diaphragm 153 for varying the quantity of light which passes through the lens 152. The imaging apparatus 154 corresponds to any one of the imaging apparatuses 100 of the first to fifth embodiments. The lens 152 and the diaphragm 153 form an optical system which condenses light to the imaging apparatus 154. In addition, the imaging system illustrated in FIG. 9 has an output signal processing unit 155 for processing an output signal which is output from the imaging apparatus 154.

The output signal processing unit 155 performs various types of corrections and compressions, as needed, and outputs the image data. The imaging system illustrated in FIG. 9 further has a buffer memory unit 156 for temporarily storing the image data therein, and an external interface unit (external I/F unit) 157 for communicating with an external computer and the like. The imaging system further has a recording medium 159 such as a semiconductor memory, for recording the image data therein or reading the image data therefrom, and a recording medium controlling interface unit (recording medium controlling I/F unit) 158 for recording the image data in or reading the image data from the recording medium 159. Incidentally, the recording medium 159 may be built in the imaging system, or may also be removable.

The imaging system further has a general control/operation unit 1510 which performs various arithmetic operations and controls the whole digital still camera, and a timing generating unit 1511 which outputs various timing signals to the imaging apparatus 154 and the output signal processing unit 155. Here, the timing signal and the like may be input from the outside; and the imaging system may have at least the imaging apparatus 154 and the output signal processing unit 155 which processes the output signal output from the imaging apparatus 154. As in the above description, the imaging system of the present embodiment can perform an imaging operation by having the imaging apparatus 154 applied thereto.

Note that the above embodiments are merely examples how the present invention can be practiced, and the technical scope of the present invention should not be restrictively interpreted by the embodiments. In other words, the present invention can be practiced in various ways without departing from the technical concept or main features of the invention.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

Effect of the Invention

The imaging apparatus can make the loop small which is formed by a path of supplying a first potential therethrough that is supplied to first and second signal processing circuits, and a path of supplying a second potential therethrough that is supplied to the pixels, and can reduce the noise which originates in the magnetic field incident externally.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-237006, filed Nov. 21, 2014, and Japanese Patent Application No. 2015-043853, filed Mar. 5, 2015 which are hereby incorporated by reference herein in their entirety.

What is claimed is:

1. An imaging apparatus comprising:
a pixel region including a first group of pixels configured to perform a photoelectric conversion and a second group of pixels configured to perform the photoelectric conversion, each of pixels in the first and second groups being a pixel which outputs an output signal based on the photoelectric conversion;
a first signal processing unit arranged in a first direction with regard to the pixel region, and configured to perform a signal processing of the output signal from the first group of pixels;
a second signal processing unit arranged in a second direction different from the first direction, with regard to the pixel region, and configured to perform a signal processing of the output signal from the second group of pixels;
a first external connecting terminal arranged in the first direction with regard to the pixel region, and configured to supply a first voltage;
a second external connecting terminal arranged in the second direction with regard to the pixel region, and configured to supply the first voltage;
a third external connecting terminal arranged in the first direction with regard to the pixel region, and configured to supply a second voltage; and
a fourth external connecting terminal arranged in the second direction with regard to the pixel region, and configured to supply the second voltage,
wherein:
the first signal processing unit receives the first voltage from the first external connecting terminal, without receiving the first voltage from the second external connecting terminal,
the second signal processing unit receives the first voltage from the second external connecting terminal, without receiving the first voltage from the first external connecting terminal,
the first group of pixels receives the second voltage from the third external connecting terminal, without receiving the second voltage from the fourth external connecting terminal,
the second group of pixels receives the second voltage from the fourth external connecting terminal, without receiving the second voltage from the third external connecting terminal,
the first external connecting terminal, the second external connecting terminal, the third external connecting terminal and the fourth external connecting terminal are arranged outside the pixel region, and
the first direction is on a first side of the pixel region and the second direction is on a second side of the pixel region opposite the first side.

2. The imaging apparatus according to claim 1, wherein the first voltage is a reference voltage, and the second voltage is a power source voltage.

3. The imaging apparatus according to claim 1, wherein the first signal processing unit includes a first amplifying circuit configured to receive the first voltage, and amplify an output signal from the first group of pixels, and
the second signal processing unit includes a second amplifying circuit configured to receive the second voltage, and amplify an output signal from the second group of pixels.

4. The imaging apparatus according to claim 3, wherein the first amplifying circuit includes a first operational amplifier circuit,
the second amplifying circuit includes a second operational amplifier circuit,
the first operational amplifier has a non-inverting input terminal connected through a first capacitor to the first external connecting terminal, and the second operational amplifier has a non-inverting input terminal connected through a second capacitor to the second external connecting terminal.

5. The imaging apparatus according to claim 1, further comprising:
the first signal processing unit includes a first clip circuit configured to receive the first voltage, and limit an output signal from the first group of pixels, and
the second signal processing unit includes a second clip circuit configured to receive the second voltage, and limit an output signal from the second group of pixels.

6. The imaging apparatus according to claim 5, wherein the first clip circuit includes a first transistor,
the second clip circuit includes a second transistor, wherein
the first transistor has a gate connected to the first external connecting terminal, and
the second transistor has a gate connected to the second external connecting terminal.

7. The imaging apparatus according to claim 1, wherein the pixel region, the first signal processing unit, the second signal processing unit, the first external connecting terminal, the second external connecting terminal, the third external connecting terminal and the fourth external connecting terminal are arranged on one semiconductor substrate.

8. An imaging system comprising:
the imaging apparatus according to claim 1; and
an output signal processing unit configured to generate an image based on a signal processing of a signal outputted from the imaging apparatus.

9. An imaging apparatus comprising:
a pixel region including a first group of pixels configured to perform a photoelectric conversion and a second group of pixels configured to perform the photoelectric conversion, each of pixels in the first and second groups being a pixel which outputs an output signal based on the photoelectric conversion;
a first signal processing unit arranged in a first direction with regard to the pixel region, and configured to perform a signal processing of the output signal from the first group of pixels;
a second signal processing unit arranged in a second direction different from the first direction, with regard to the pixel region, and configured to perform a signal processing of the output signal from the second group of pixels;
a first external connecting terminal arranged in the first direction with regard to the pixel region, and configured to supply a first voltage;
a second external connecting terminal arranged in the second direction with regard to the pixel region, and configured to supply the first voltage;
a third external connecting terminal arranged in the first direction with regard to the pixel region, and configured to supply a second voltage;
a fourth external connecting terminal arranged in the second direction with regard to the pixel region, and configured to supply the second voltage;
a first driving buffer configured to output a control signal to the first group of pixels; and
a second driving buffer configured to output a control signal to the second group of pixels,
wherein:
the first signal processing unit receives the supplying with the first voltage from the first external connecting terminal, without receiving the first voltage from the second external connecting terminal, the second signal processing unit receives the supplying with the first voltage from the second external connecting terminal, without receiving the first voltage from the first external connecting terminal,
the first driving buffer receives the second voltage from the third external connecting terminal, without receiving the second voltage from the fourth external connecting terminal,
the second driving buffer receives the second voltage from the fourth external connecting terminal, without receiving the second voltage from the third external connecting terminal,
the first external connecting terminal, the second external connecting terminal, the third external connecting terminal and the fourth external connecting terminal are arranged outside the pixel region, and
the first direction is on a first side of the pixel region and the second direction is on a second side of the pixel region opposite the first side.

10. The imaging apparatus according to claim 9, wherein each of pixels in the first and second groups has a photoelectric conversion portion configured to generate an electric charge based on an incident light, a pixel output portion configured to output the output signal and a transfer switch configured to perform switching between a connection and a disconnection between the photoelectric conversion portion and the pixel output portion, and wherein
the control signals outputted from the first and second driving buffers are signals each of which controls the switching by the transfer switch.

11. The imaging apparatus according to claim 9, wherein each of pixels in the first and second groups has a photoelectric conversion portion configured to generate an electric charge based on an incident light, a floating diffusion inputting the electric charge from the photoelectric conversion portion, a pixel output portion configured to output the output signal based on a voltage in the floating diffusion and a reset switch configured to perform switching between a connection and a disconnection between the floating diffusion and a source voltage, and wherein
the control signals outputted from the first and second driving buffers are signals each of which controls the switching by the reset switch.

12. The imaging apparatus according to claim 9, further comprising:
a first vertical output line configured to output the output signal from the first group of pixels to the first signal processing circuit, and
a second vertical output line configured to output the output signal from the second group of pixels to the second signal processing circuit, wherein
each of pixels in the first and second groups has a photoelectric conversion portion configured to generate an electric charge based on an incident light, a pixel output portion configured to output the output signal and a selecting switch, and wherein
the selecting switch of the first group is configured to perform switching between a connection and a disconnection between the pixel output portion of a pixel included in the first group and the first vertical output line,
the selecting switch of the second group is configured to perform switching between a connection and a disconnection between the pixel output portion of a pixel included in the second group and the second vertical output line, and the control signals outputted from the first and second driving buffers are signals each of which controls between the switching by the selecting switch.

13. The imaging apparatus according to claim 9, wherein the pixel region includes a plurality of pixels arranged in a matrix, each of rows includes the pixels of the first and second groups, one of the first driving buffers and one of the second driving buffers are arranged to one of the rows, the imaging apparatus further comprises a plurality of switches each arranged correspondingly to one of the rows, and are connected between the third and fourth external connecting terminals, the plurality of switches are operated such that one of the plurality of switches arranged corresponding to one row selected for outputting the output signal is turned OFF while the other switches are turned ON, regarding the one row selected, the first driving buffer receives the second voltage from the third external connecting terminal, while the second driving buffer receives the second voltage from the fourth external connecting terminal.

14. The imaging apparatus according to claim 9, further comprising:

a first amplifying circuit configured to control at least one of an amplitude and a phase, of an alternating component of the second voltage from the third external connecting terminal, and a second amplifying circuit configured to control at least one of an amplitude and a phase, of an alternating component of the second voltage from the fourth external connecting terminal.

15. The imaging apparatus according to claim 14, further comprising:

a fifth external connecting terminal arranged in the first direction with regard to the pixel region, and configured to supply a third voltage; and a sixth external connecting terminal arranged in the second direction with regard to the pixel region, and configured to supply the third voltage; wherein the first group of pixels is supplied with the third voltage from the fifth external connecting terminal, without receiving the third voltage from the sixth external connecting terminal, the second group of pixels is supplied with the third voltage from the sixth external connecting terminal, without receiving the third voltage from the fifth external connecting terminal, each of the first and second amplifying circuits control at least one of the amplitude and the phase, of the alternating component, to cancel a noise respectively introduced into loops formed by the fifth and sixth external connecting terminals.

16. An imaging system comprising:

the imaging apparatus according to claim 9; and an output signal processing unit configured to generate an image based on a signal processing of a signal outputted from the imaging apparatus.

* * * * *